United States Patent
Maligeorgos et al.

(10) Patent No.: US 12,386,029 B2
(45) Date of Patent: Aug. 12, 2025

(54) MILLIMETER WAVE AUTOMOTIVE RADAR SYSTEMS

(71) Applicant: UHNDER, INC., Austin, TX (US)

(72) Inventors: James Maligeorgos, Toronto (CA); Aria Eshraghi, Austin, TX (US); Ryan Lobo, Austin, TX (US); Lysander Lim, Austin, TX (US); Vito Giannini, Austin, TX (US); Marius Goldenberg, Austin, TX (US)

(73) Assignee: Robert Bosch Gmbh, Gerlingen (DE)

( * ) Notice: Subject to any disclaimer, the term of this patent is extended or adjusted under 35 U.S.C. 154(b) by 990 days.

(21) Appl. No.: 16/259,474

(22) Filed: Jan. 28, 2019

(65) Prior Publication Data
US 2019/0235050 A1  Aug. 1, 2019

Related U.S. Application Data

(60) Provisional application No. 62/623,092, filed on Jan. 29, 2018.

(51) Int. Cl.
- G01S 7/35 (2006.01)
- G01S 7/03 (2006.01)
- (Continued)

(52) U.S. Cl.
CPC .............. G01S 7/352 (2013.01); G01S 7/032 (2013.01); G01S 13/325 (2013.01); (Continued)

(58) Field of Classification Search
CPC ........ G01S 7/352; G01S 7/032; G01S 13/325; G01S 13/931; G01S 2013/93271; (Continued)

(56) References Cited

U.S. PATENT DOCUMENTS

| | | |
|---|---|---|
| 1,882,128 A | 10/1932 | Fearing |
| 3,374,478 A | 3/1968 | Blau |

(Continued)

FOREIGN PATENT DOCUMENTS

| | | |
|---|---|---|
| EP | 0725480 | 11/2011 |
| EP | 2374217 | 4/2013 |

(Continued)

OTHER PUBLICATIONS

V. Jain, F. Tzeng, L. Zhou and P. Heydari, "A Single-Chip Dual-Band 22-29-GHz/77-81-GHz BiCMOS Transceiver for Automotive Radars," in IEEE Journal of Solid-State Circuits, vol. 44, No. 12, pp. 3469-3485, Dec. 2009, doi: 10.1109/JSSC.2009.2032583. (Year: 2009).*

(Continued)

*Primary Examiner* — Vladimir Magloire
*Assistant Examiner* — Yonghong Li
(74) *Attorney, Agent, or Firm* — Gardner, Linn, Burkhart & Ondersma LLP

(57) ABSTRACT

A radar sensing system includes a transmitter and a receiver. The transmitter is configured for installation and use in a vehicle and configured to transmit radio signals. The receiver is configured for installation and use in the vehicle and configured to receive radio signals that include the transmitted radio signals transmitted by the transmitter and reflected from objects in an environment. The receiver includes a plurality of inputs and a plurality of low noise amplifiers (LNAs). Each input of the plurality of inputs is communicatively coupled to a corresponding LNA of the plurality of LNAs. The plurality of LNAs are co-located, and respective outputs of the plurality of LNAs are all directly coupled together at a connection point.

19 Claims, 30 Drawing Sheets

(51) Int. Cl.
    *G01S 13/32*     (2006.01)
    *G01S 13/931*     (2020.01)
    *H03F 1/56*     (2006.01)
    *H03F 3/19*     (2006.01)
    *H03F 3/45*     (2006.01)

(52) U.S. Cl.
    CPC ............ *G01S 13/931* (2013.01); *H03F 1/565* (2013.01); *H03F 3/19* (2013.01); *H03F 3/45179* (2013.01); *G01S 2013/93271* (2020.01); *H03F 2200/222* (2013.01); *H03F 2200/294* (2013.01); *H03F 2200/387* (2013.01); *H03F 2200/435* (2013.01); *H03F 2200/451* (2013.01)

(58) Field of Classification Search
    CPC ........ H03F 1/565; H03F 3/19; H03F 3/45179; H03F 2200/222; H03F 2200/294; H03F 2200/387; H03F 2200/435; H03F 2200/451
    See application file for complete search history.

(56) References Cited

U.S. PATENT DOCUMENTS

| | | | |
|---|---|---|---|
| 3,735,398 A | 5/1973 | Ross | |
| 3,750,169 A | 7/1973 | Strenglein | |
| 3,896,434 A | 7/1975 | Sirven | |
| 4,078,234 A | 3/1978 | Fishbein et al. | |
| 4,176,351 A | 11/1979 | De Vita et al. | |
| 4,566,010 A | 1/1986 | Collins | |
| 4,882,668 A | 11/1989 | Schmid et al. | |
| 4,910,464 A | 3/1990 | Trett et al. | |
| 4,939,685 A | 7/1990 | Feintuch | |
| 5,001,486 A | 3/1991 | Bächtiger | |
| 5,034,906 A | 7/1991 | Chang | |
| 5,087,918 A | 2/1992 | May et al. | |
| 5,151,702 A | 9/1992 | Urkowitz | |
| 5,175,710 A | 12/1992 | Hutson | |
| 5,218,619 A | 6/1993 | Dent | |
| 5,272,663 A | 12/1993 | Jones et al. | |
| 5,280,288 A | 1/1994 | Sherry et al. | |
| 5,302,956 A | 4/1994 | Asbury et al. | |
| 5,341,141 A | 8/1994 | Frazier et al. | |
| 5,345,470 A | 9/1994 | Alexander | |
| 5,376,939 A | 12/1994 | Urkowitz | |
| 5,379,322 A | 1/1995 | Kosaka et al. | |
| 5,497,162 A | 3/1996 | Kaiser | |
| 5,508,706 A | 4/1996 | Tsou et al. | |
| 5,581,464 A | 12/1996 | Woll et al. | |
| 5,654,715 A | 8/1997 | Hayashikura et al. | |
| 5,657,021 A | 8/1997 | Ehsani-Nategh et al. | |
| 5,657,023 A | 8/1997 | Lewis et al. | |
| 5,691,724 A | 11/1997 | Aker et al. | |
| 5,712,640 A | 1/1998 | Andou | |
| 5,724,041 A | 3/1998 | Inoue et al. | |
| 5,847,661 A | 12/1998 | Ricci | |
| 5,892,477 A | 4/1999 | Wehling | |
| 5,917,430 A | 6/1999 | Greneker, III et al. | |
| 5,920,285 A | 7/1999 | Benjamin | |
| 5,931,893 A | 8/1999 | Dent et al. | |
| 5,959,571 A | 9/1999 | Aoyagi et al. | |
| 5,970,400 A | 10/1999 | Dwyer | |
| 6,067,314 A | 5/2000 | Azuma | |
| 6,069,581 A | 5/2000 | Bell et al. | |
| 6,121,872 A | 9/2000 | Weishaupt | |
| 6,121,918 A | 9/2000 | Tullsson | |
| 6,151,366 A | 11/2000 | Yip | |
| 6,163,252 A | 12/2000 | Nishiwaki | |
| 6,184,829 B1 | 2/2001 | Stilp | |
| 6,191,726 B1 | 2/2001 | Tullsson | |
| 6,288,672 B1 | 9/2001 | Asano et al. | |
| 6,307,622 B1 | 10/2001 | Lewis | |
| 6,335,700 B1 | 1/2002 | Ashihara | |
| 6,347,264 B2 | 2/2002 | Nicosia et al. | |
| 6,400,308 B1 | 6/2002 | Bell et al. | |
| 6,411,250 B1 | 6/2002 | Oswald et al. | |
| 6,417,796 B1 | 7/2002 | Bowlds | |
| 6,424,289 B2 | 7/2002 | Fukae et al. | |
| 6,583,753 B1 | 6/2003 | Reed | |
| 6,614,387 B1 | 9/2003 | Deadman | |
| 6,624,784 B1 | 9/2003 | Yamaguchi | |
| 6,674,908 B1 | 1/2004 | Aronov | |
| 6,683,560 B2 | 1/2004 | Bauhahn | |
| 6,714,956 B1 | 3/2004 | Liu et al. | |
| 6,747,595 B2 | 6/2004 | Hirabe | |
| 6,768,391 B1 | 7/2004 | Dent et al. | |
| 6,865,218 B1 | 3/2005 | Sourour | |
| 6,888,491 B2 | 5/2005 | Richter | |
| 6,975,246 B1 | 12/2005 | Trudeau | |
| 7,119,739 B1 | 10/2006 | Struckman | |
| 7,289,058 B2 | 10/2007 | Shima | |
| 7,299,251 B2 | 11/2007 | Skidmore et al. | |
| 7,338,450 B2 | 3/2008 | Kristofferson et al. | |
| 7,395,084 B2 | 7/2008 | Anttila | |
| 7,460,055 B2 | 12/2008 | Nishijima et al. | |
| 7,474,258 B1 | 1/2009 | Arikan et al. | |
| 7,545,310 B2 | 6/2009 | Matsuoka | |
| 7,545,321 B2 | 6/2009 | Kawasaki | |
| 7,564,400 B2 | 7/2009 | Fukuda | |
| 7,567,204 B2 | 7/2009 | Sakamoto | |
| 7,609,198 B2 | 10/2009 | Chang | |
| 7,642,952 B2 | 1/2010 | Fukuda | |
| 7,663,533 B2 | 2/2010 | Toennesen | |
| 7,728,762 B2 | 6/2010 | Sakamoto | |
| 7,791,528 B2 | 9/2010 | Klotzbuecher | |
| 7,847,731 B2 | 12/2010 | Wiesbeck et al. | |
| 7,855,677 B2 | 12/2010 | Negoro et al. | |
| 7,859,450 B2 | 12/2010 | Shirakawa et al. | |
| 8,019,352 B2 | 9/2011 | Rappaport et al. | |
| 8,044,845 B2 | 10/2011 | Saunders | |
| 8,049,663 B2 | 11/2011 | Frank et al. | |
| 8,059,026 B1 | 11/2011 | Nunez | |
| 8,102,306 B2 | 1/2012 | Smith, Jr. et al. | |
| 8,154,436 B2 | 4/2012 | Szajnowski | |
| 8,212,713 B2 | 7/2012 | Aiga et al. | |
| 8,330,650 B2 | 12/2012 | Goldman | |
| 8,390,507 B2 | 3/2013 | Wintermantel | |
| 8,471,760 B2 | 6/2013 | Szajnowski | |
| 8,532,159 B2 | 9/2013 | Kagawa et al. | |
| 8,547,988 B2 | 10/2013 | Hadani et al. | |
| 8,686,894 B2 | 4/2014 | Fukuda et al. | |
| 8,694,306 B1 | 4/2014 | Short et al. | |
| 8,929,945 B1 * | 1/2015 | Wei ..................... | H04B 1/0057 |
| | | | 330/195 |
| 8,994,581 B1 | 3/2015 | Brown | |
| 9,121,943 B2 | 9/2015 | Stirlin-Gallacher et al. | |
| 9,239,378 B2 | 1/2016 | Kishigami et al. | |
| 9,239,379 B2 | 1/2016 | Burgio et al. | |
| 9,282,945 B2 | 3/2016 | Smith et al. | |
| 9,335,402 B2 | 5/2016 | Maeno et al. | |
| 9,400,328 B2 | 7/2016 | Hsiao et al. | |
| 9,541,639 B2 | 1/2017 | Searcy et al. | |
| 9,568,600 B2 | 2/2017 | Alland | |
| 9,575,160 B1 | 2/2017 | Davis et al. | |
| 9,599,702 B1 | 3/2017 | Bordes et al. | |
| 9,618,616 B2 * | 4/2017 | Kishigami ................ | G01S 7/40 |
| 9,689,967 B1 | 6/2017 | Stark et al. | |
| 9,720,073 B1 | 8/2017 | Davis et al. | |
| 9,720,080 B1 | 9/2017 | Rodenbeck | |
| 9,753,121 B1 | 9/2017 | Davis | |
| 9,753,132 B1 | 9/2017 | Bordes et al. | |
| 9,772,397 B1 | 9/2017 | Bordes et al. | |
| 9,791,551 B1 | 10/2017 | Eshraghi et al. | |
| 9,791,564 B1 | 10/2017 | Harris et al. | |
| 9,806,914 B1 | 10/2017 | Bordes et al. | |
| 9,829,567 B1 | 11/2017 | Davis et al. | |
| 9,846,228 B2 | 12/2017 | Davis et al. | |
| 9,869,762 B1 | 1/2018 | Alland et al. | |
| 10,090,585 B2 * | 10/2018 | Dinc ..................... | H01Q 1/525 |
| 2001/0002919 A1 | 6/2001 | Sourour et al. | |
| 2002/0004692 A1 | 1/2002 | Nicosia et al. | |
| 2002/0044082 A1 | 4/2002 | Woodington et al. | |

(56) References Cited

U.S. PATENT DOCUMENTS

| | | |
|---|---|---|
| 2002/0075178 A1 | 6/2002 | Woodington et al. |
| 2002/0118522 A1 | 8/2002 | Ho et al. |
| 2002/0130811 A1 | 9/2002 | Voigtlaender |
| 2002/0147534 A1 | 10/2002 | Delcheccolo et al. |
| 2002/0155811 A1 | 10/2002 | Prismantas |
| 2003/0001772 A1 | 1/2003 | Woodington et al. |
| 2003/0011519 A1 | 1/2003 | Breglia et al. |
| 2003/0058166 A1 | 3/2003 | Hirabe |
| 2003/0073463 A1 | 4/2003 | Shapira |
| 2003/0080713 A1 | 5/2003 | Kirmuss |
| 2003/0102997 A1 | 6/2003 | Levin et al. |
| 2003/0235244 A1 | 12/2003 | Pessoa et al. |
| 2004/0012516 A1 | 1/2004 | Schiffmann |
| 2004/0015529 A1 | 1/2004 | Tanrkulu et al. |
| 2004/0066323 A1 | 4/2004 | Richter |
| 2004/0107030 A1 | 6/2004 | Nishira et al. |
| 2004/0138802 A1 | 7/2004 | Kuragaki et al. |
| 2004/0215373 A1 | 10/2004 | Won et al. |
| 2005/0069162 A1 | 3/2005 | Haykin |
| 2005/0090274 A1 | 4/2005 | Miyashita |
| 2005/0156780 A1 | 7/2005 | Bonthron et al. |
| 2005/0201457 A1 | 9/2005 | Allred et al. |
| 2005/0225476 A1 | 10/2005 | Hoetzel et al. |
| 2005/0273480 A1 | 12/2005 | Pugh et al. |
| 2006/0012511 A1 | 1/2006 | Dooi et al. |
| 2006/0036353 A1 | 2/2006 | Wintermantel |
| 2006/0050707 A1 | 3/2006 | Sterin |
| 2006/0093078 A1 | 5/2006 | Lewis et al. |
| 2006/0109170 A1 | 5/2006 | Voigtlaender et al. |
| 2006/0109931 A1 | 5/2006 | Asai |
| 2006/0114324 A1 | 6/2006 | Farmer et al. |
| 2006/0140249 A1 | 6/2006 | Kohno |
| 2006/0181448 A1 | 8/2006 | Natsume et al. |
| 2006/0244653 A1 | 11/2006 | Szajnowski |
| 2006/0262007 A1* | 11/2006 | Bonthron ............... G01S 13/44 342/107 |
| 2006/0262009 A1 | 11/2006 | Watanabe |
| 2007/0018884 A1 | 1/2007 | Adams |
| 2007/0018886 A1 | 1/2007 | Watanabe et al. |
| 2007/0096885 A1 | 5/2007 | Cheng et al. |
| 2007/0109175 A1 | 5/2007 | Fukuda |
| 2007/0115869 A1 | 5/2007 | Lakkis |
| 2007/0120731 A1 | 5/2007 | Kelly, Jr. et al. |
| 2007/0132633 A1 | 6/2007 | Uchino |
| 2007/0152870 A1 | 7/2007 | Woodington et al. |
| 2007/0152871 A1 | 7/2007 | Puglia |
| 2007/0152872 A1 | 7/2007 | Woodington |
| 2007/0164896 A1 | 7/2007 | Suzuki et al. |
| 2007/0171122 A1 | 7/2007 | Nakano |
| 2007/0182619 A1 | 8/2007 | Honda et al. |
| 2007/0182623 A1 | 8/2007 | Zeng |
| 2007/0188373 A1 | 8/2007 | Shirakawa et al. |
| 2007/0200747 A1 | 8/2007 | Okai |
| 2007/0263748 A1 | 11/2007 | Mesecher |
| 2007/0279303 A1 | 12/2007 | Schoebel |
| 2008/0088499 A1 | 4/2008 | Bonthron |
| 2008/0094274 A1 | 4/2008 | Nakanishi |
| 2008/0150790 A1 | 6/2008 | Voigtlaender et al. |
| 2008/0180311 A1 | 7/2008 | Mikami |
| 2008/0208472 A1 | 8/2008 | Morcom |
| 2008/0218406 A1 | 9/2008 | Nakanishi |
| 2008/0258964 A1 | 10/2008 | Schoeberl |
| 2008/0272955 A1 | 11/2008 | Yonak et al. |
| 2009/0003412 A1 | 1/2009 | Negoro et al. |
| 2009/0015459 A1 | 1/2009 | Mahler et al. |
| 2009/0015464 A1 | 1/2009 | Fukuda |
| 2009/0021429 A1* | 1/2009 | Colburn ............... H01Q 25/02 342/372 |
| 2009/0027257 A1 | 1/2009 | Arikan |
| 2009/0046000 A1 | 2/2009 | Matsuoka |
| 2009/0051581 A1 | 2/2009 | Hatono |
| 2009/0072957 A1 | 3/2009 | Wu et al. |
| 2009/0073025 A1 | 3/2009 | Inoue et al. |
| 2009/0074031 A1 | 3/2009 | Fukuda |
| 2009/0079617 A1 | 3/2009 | Shirakawa et al. |
| 2009/0085827 A1 | 4/2009 | Orime et al. |
| 2009/0103593 A1 | 4/2009 | Bergamo |
| 2009/0121918 A1 | 5/2009 | Shirai et al. |
| 2009/0212998 A1 | 8/2009 | Szajnowski |
| 2009/0237293 A1 | 9/2009 | Sakuma |
| 2009/0254260 A1 | 10/2009 | Nix et al. |
| 2009/0267822 A1 | 10/2009 | Shinoda et al. |
| 2009/0289831 A1 | 11/2009 | Akita |
| 2009/0295623 A1 | 12/2009 | Falk |
| 2010/0001897 A1 | 1/2010 | Lyman |
| 2010/0019950 A1 | 1/2010 | Yamano et al. |
| 2010/0039311 A1 | 2/2010 | Woodington et al. |
| 2010/0116365 A1 | 5/2010 | McCarty |
| 2010/0156690 A1 | 6/2010 | Kim et al. |
| 2010/0198513 A1 | 8/2010 | Zeng et al. |
| 2010/0253573 A1 | 10/2010 | Holzheimer et al. |
| 2010/0277359 A1 | 11/2010 | Ando |
| 2010/0289692 A1 | 11/2010 | Winkler |
| 2011/0006944 A1 | 1/2011 | Goldman |
| 2011/0032138 A1 | 2/2011 | Krapf |
| 2011/0074620 A1 | 3/2011 | Wintermantel |
| 2011/0187600 A1 | 8/2011 | Landt |
| 2011/0196568 A1 | 8/2011 | Nickolaou |
| 2011/0248796 A1 | 10/2011 | Pozgay |
| 2011/0279303 A1 | 11/2011 | Smith, Jr. et al. |
| 2011/0279307 A1 | 11/2011 | Song |
| 2011/0285576 A1 | 11/2011 | Lynam |
| 2011/0291874 A1 | 12/2011 | De Mersseman |
| 2011/0291875 A1 | 12/2011 | Szajnowski |
| 2011/0292971 A1 | 12/2011 | Hadani et al. |
| 2011/0298653 A1 | 12/2011 | Mizutani |
| 2012/0001791 A1 | 1/2012 | Wintermantel |
| 2012/0050093 A1 | 3/2012 | Heilmann et al. |
| 2012/0105268 A1 | 5/2012 | Smits et al. |
| 2012/0112957 A1 | 5/2012 | Nguyen et al. |
| 2012/0133547 A1 | 5/2012 | MacDonald et al. |
| 2012/0173246 A1 | 7/2012 | Choi et al. |
| 2012/0195349 A1 | 8/2012 | Lakkis |
| 2012/0249356 A1 | 10/2012 | Shope |
| 2012/0257643 A1 | 10/2012 | Wu et al. |
| 2012/0314799 A1 | 12/2012 | In De Betou et al. |
| 2012/0319900 A1 | 12/2012 | Johansson et al. |
| 2013/0016761 A1 | 1/2013 | Nentwig |
| 2013/0021196 A1 | 1/2013 | Himmelstoss |
| 2013/0027240 A1 | 1/2013 | Chowdhury |
| 2013/0069818 A1 | 3/2013 | Shirakawa et al. |
| 2013/0102254 A1 | 4/2013 | Cyzs |
| 2013/0113647 A1 | 5/2013 | Sentelle et al. |
| 2013/0113652 A1 | 5/2013 | Smits et al. |
| 2013/0113653 A1* | 5/2013 | Kishigami ............... G01S 7/285 342/189 |
| 2013/0135140 A1 | 5/2013 | Kishigami |
| 2013/0169468 A1 | 7/2013 | Johnson et al. |
| 2013/0169485 A1 | 7/2013 | Lynch |
| 2013/0176154 A1 | 7/2013 | Bonaccio et al. |
| 2013/0214961 A1 | 8/2013 | Lee et al. |
| 2013/0229301 A1 | 9/2013 | Kanamoto |
| 2013/0244710 A1 | 9/2013 | Nguyen et al. |
| 2013/0249730 A1 | 9/2013 | Adcook |
| 2013/0314271 A1 | 11/2013 | Braswell et al. |
| 2013/0321196 A1 | 12/2013 | Binzer et al. |
| 2014/0022108 A1 | 1/2014 | Alberth, Jr. et al. |
| 2014/0028491 A1 | 1/2014 | Ferguson |
| 2014/0035774 A1 | 2/2014 | Khlifi |
| 2014/0070985 A1 | 3/2014 | Vacanti |
| 2014/0085128 A1 | 3/2014 | Kishigami et al. |
| 2014/0097987 A1 | 4/2014 | Worl et al. |
| 2014/0111367 A1 | 4/2014 | Kishigami et al. |
| 2014/0111372 A1 | 4/2014 | Wu |
| 2014/0139322 A1 | 5/2014 | Wang et al. |
| 2014/0159948 A1 | 6/2014 | Ishimori et al. |
| 2014/0220903 A1 | 8/2014 | Schulz et al. |
| 2014/0253345 A1 | 9/2014 | Breed |
| 2014/0253364 A1 | 9/2014 | Lee et al. |
| 2014/0285373 A1 | 9/2014 | Kuwahara et al. |
| 2014/0316261 A1 | 10/2014 | Lux et al. |
| 2014/0327566 A1 | 11/2014 | Burgio et al. |
| 2014/0340254 A1 | 11/2014 | Hesse |
| 2014/0348253 A1 | 11/2014 | Mobasher et al. |

(56) References Cited

U.S. PATENT DOCUMENTS

| | | |
|---|---|---|
| 2015/0002329 A1 | 1/2015 | Murad et al. |
| 2015/0002357 A1 | 1/2015 | Sanford et al. |
| 2015/0035662 A1 | 2/2015 | Bowers et al. |
| 2015/0061922 A1 | 3/2015 | Kishigami |
| 2015/0103745 A1 | 4/2015 | Negus et al. |
| 2015/0198709 A1 | 7/2015 | Inoue |
| 2015/0204966 A1 | 7/2015 | Kishigami |
| 2015/0204971 A1 | 7/2015 | Yoshimura et al. |
| 2015/0204972 A1 | 7/2015 | Kuehnle et al. |
| 2015/0226848 A1 | 8/2015 | Park |
| 2015/0234045 A1 | 8/2015 | Rosenblum |
| 2015/0247924 A1 | 9/2015 | Kishigami |
| 2015/0255867 A1 | 9/2015 | Inoue |
| 2015/0301172 A1 | 10/2015 | Ossowska |
| 2015/0323660 A1 | 11/2015 | Hampikian |
| 2015/0331090 A1 | 11/2015 | Jeong et al. |
| 2015/0369912 A1 | 12/2015 | Kishigami et al. |
| 2016/0003938 A1 | 1/2016 | Gazit et al. |
| 2016/0003939 A1 | 1/2016 | Stainvas Olshansky et al. |
| 2016/0018511 A1 | 1/2016 | Nayyar et al. |
| 2016/0033631 A1 | 2/2016 | Searcy et al. |
| 2016/0033632 A1 | 2/2016 | Searcy et al. |
| 2016/0041260 A1 | 2/2016 | Cao et al. |
| 2016/0054441 A1 | 2/2016 | Kuo et al. |
| 2016/0061935 A1 | 3/2016 | McCloskey et al. |
| 2016/0084941 A1 | 3/2016 | Arage |
| 2016/0084943 A1 | 3/2016 | Arage |
| 2016/0091595 A1 | 3/2016 | Alcalde |
| 2016/0103206 A1 | 4/2016 | Pavao-Moreira et al. |
| 2016/0124075 A1 | 5/2016 | Vogt et al. |
| 2016/0124086 A1 | 5/2016 | Jansen et al. |
| 2016/0131752 A1 | 5/2016 | Jansen et al. |
| 2016/0139254 A1 | 5/2016 | Wittenberg |
| 2016/0146931 A1 | 5/2016 | Rao et al. |
| 2016/0154103 A1 | 6/2016 | Moriuchi |
| 2016/0178732 A1 | 6/2016 | Oka et al. |
| 2016/0213258 A1 | 7/2016 | Lashkari et al. |
| 2016/0238694 A1 | 8/2016 | Kishigami |
| 2016/0336983 A1* | 11/2016 | Wang .................. H04B 1/0458 |
| 2016/0349365 A1 | 12/2016 | Ling |
| 2017/0010361 A1 | 1/2017 | Tanaka |
| 2017/0023661 A1 | 1/2017 | Richert |
| 2017/0023663 A1 | 1/2017 | Subburaj et al. |
| 2017/0074980 A1 | 3/2017 | Adib |
| 2017/0117950 A1 | 4/2017 | Strong |
| 2017/0153316 A1 | 6/2017 | Wintermantel |
| 2017/0212213 A1* | 7/2017 | Kishigami .............. G01S 7/282 |
| 2017/0219689 A1 | 8/2017 | Hung et al. |
| 2017/0234968 A1 | 8/2017 | Roger et al. |
| 2017/0293025 A1 | 10/2017 | Davis et al. |
| 2017/0293027 A1 | 10/2017 | Stark et al. |
| 2017/0307728 A1 | 10/2017 | Eshraghi et al. |
| 2017/0309997 A1 | 10/2017 | Alland et al. |
| 2017/0310758 A1 | 10/2017 | Davis et al. |
| 2017/0336495 A1 | 11/2017 | Davis et al. |

FOREIGN PATENT DOCUMENTS

| | | |
|---|---|---|
| EP | 2821808 | 7/2015 |
| FR | 2751086 | 1/1998 |
| WO | WO2015175078 | 11/2015 |
| WO | WO2015185058 | 12/2015 |
| WO | WO2016011407 | 1/2016 |
| WO | WO2016030656 | 3/2016 |
| WO | WO2017187330 | 11/2017 |

OTHER PUBLICATIONS

A. Medra et al., "An 80 GHz Low-Noise Amplifier Resilient to the TX Spillover in Phase-Modulated Continuous-Wave Radars," in IEEE Journal of Solid-State Circuits, vol. 51, No. 5, pp. 1141-1153, May 2016, doi: 10.1109/JSSC.2016.2520962. (Year: 2016).*

RadarRangeEquation2011.pdf from http://www.ece.uah.edu/courses/material/EE619-2011/RadarRangeEquation(2)2011.pdf (Year: 2011).*

What are S-Parameters_—everything RF.pdf from https://www.everythingrf.com/community/what-are-s-parameters (Year: 2018).*

N. M. Neihart, J. Brown and X. Yu, "A Dual-Band 2.45/6 GHz CMOS LNA Utilizing a Dual-Resonant Transformer-Based Matching Network," in IEEE Transactions on Circuits and Systems I: Regular Papers, vol. 59, No. 8, pp. 1743-1751, Aug. 2012, doi: 10.1109/TCSI.2011.2180436. (Year: 2012)*

Chambers et al., "An article entitled Real-Time Vehicle Mounted Multistatic Ground Penetrating Radar Imaging System for Buried Object Detection," Lawrence Livermore National Laboratory Reports (LLNL-TR-615452), Feb. 4, 2013; Retrieved from the Internet from https://e-reports-ext.llnl.gov/pdf/711892.pdf.

Fraser, "Design and simulation of a coded sequence ground penetrating radar," In: Diss. University of British Columbia, Dec. 3, 2015.

Zhou et al., "Linear extractors for extracting randomness from noisy sources," In: Information Theory Proceedings (ISIT), 2011 IEEE International Symposium on Oct. 3, 2011.

V. Giannini et al., "A 79 GHz Phase-Modulated 4 GHz-BW CW Radar Transmitter in 28 nm CMOS," in IEEE Journal of Solid-State Circuits, vol. 49, No. 12, pp. 2925-2937, Dec. 2014. (Year: 2014).

Óscar Faus García, "Signal Processing for mm Wave MIMO Radar," University of Gavle, Faculty of Engineering and Sustainable Development, Jun. 2015; Retrieved from the Internet from http://www.diva-portal.se/smash/get/diva2:826028/FULLTEXT01.pdf.

* cited by examiner

| Function | Range (m) Min | Range (m) Max | σ (dBsm) Min | σ (dBsm) Max | Dynamic Range (dB) |
|---|---|---|---|---|---|
| LRR | 40 | 320 | 0 | 40 | 76 |
| MRR | 5 | 40 | -10 | 40 | 86 |
| SRR | 0.2 | 5 | -10 | 40 | 137 |

$$\text{Dynamic Range} = 40 \log_{10}\left(\frac{R_{max}}{R_{min}}\right) + (\sigma_{max} - \sigma_{min})$$

FIG. 5

Block diagram of the implemented Radar system-on-chip: a mm-wave TRX (12Tx+8x2Rx) is combined with a configurable hardware pipeline with up to 20 Tera-Ops processing.

The quadrature GMSK transmitter architecture.

Schematic of one power-amplifier stage, including a peak-detector.

A sample line graph using colors which contrast well both on screen and on a black-and-white hardcopy The receiver architecture, including the interference canceling analog-digital feedback, the digital front-end and the data control unit.

Radar System-on-Chip die photograph.

TX GMSK (black) vs. BPSK (red) modulated output for different chip rates, carrier and sampling frequency. The artifacts on the right side of the spectrum are due to R&S harmonic mixer.

Radar correlation plot with a +25 dBsm corner reflector placed at 300m on the field. SNR is about 30dB.

A 0.95 deg angular resolution is proved in the anechoic chamber using an 8x8 configuration. MUSIC Spectrum is the blue line, and beam-forming is dashed green line.

MILLIMETER WAVE AUTOMOTIVE RADAR SYSTEMS

CROSS REFERENCE TO RELATED APPLICATIONS

The present application claims the filing benefits of U.S. provisional application, Ser. No. 62/623,092, filed Jan. 29, 2018, which is hereby incorporated by reference herein in its entirety.

FIELD OF THE INVENTION

The present invention is directed to radar systems, and more particularly to radar systems for vehicles.

BACKGROUND OF THE INVENTION

The use of radar to determine range and velocity of objects in an environment is important in a number of applications including target and gesture detection. There may be multiple radar systems embedded into an automobile. Each of these could also employ multiple transmitters, receivers, and antennas. A radar system typically operates by transmitting signals from one or more transmitters and then listening for the reflection of that signal from objects in the environment at one or more receivers. By comparing the transmitted signal with the received signal, a radar system can determine the distance to different objects. Using multiple transmissions, the velocity of an object can be determined. Using multiple transmitters and/or receivers, the angle (azimuth and/or elevation) of an object can be estimated.

SUMMARY OF THE INVENTION

The present invention provides methods and a system for achieving better performance in a radar system implemented as a modulated continuous wave radar. Various embodiments of the present invention provide millimeter wave operation of the radar system. These embodiments include one or more receivers, each receiver may include a plurality of inputs coupled to antenna outputs and a plurality of low noise amplifiers (LNAs) associated with the antenna outputs. Each of the receive inputs feeds into a corresponding LNA of the plurality of LNAs. The plurality of LNAs are co-located, and respective outputs of the plurality of LNAs are directly coupled together at a connection point.

A radar sensing system in accordance with an embodiment of the present invention includes a transmitter and a receiver. The transmitter is configured for installation and use in a vehicle and configured to transmit radio signals. The receiver is configured for installation and use in the vehicle and configured to receive radio signals that include the transmitted radio signals transmitted by the transmitter and reflected from objects in an environment. The receiver includes a plurality of inputs and a plurality of low noise amplifiers (LNAs). Each input of the plurality of inputs is communicatively coupled to a corresponding LNA of the plurality of LNAs. The plurality of LNAs are co-located, and respective outputs of the plurality of LNAs are directly coupled together at a connection point.

A radar sensing system in accordance with an embodiment of the present invention includes a plurality of transmitters and a plurality of receivers. The plurality of transmitters is configured for installation and use in a vehicle, and is configured to transmit radio signals. The plurality of receivers is configured for installation and use in the vehicle, and is configured to receive radio signals that include the transmitted radio signals transmitted by the transmitters and reflected from objects in an environment. A first receiver of the plurality of receivers comprises first and second antenna outputs and first and second low noise amplifiers (LNAs). The first and second antenna outputs feed into the corresponding first and second LNAs, respectively. The first and second LNAs are co-located. Respective outputs of the first and second LNAs are directly coupled together at a connection point. The first and second antenna outputs and the first and second LNAs are symmetrically arranged around the connection point.

In an aspect of the present invention, the receiver inputs are antenna outputs.

In another aspect of the present invention, the radar sensing system may include a plurality of inductive-matching networks positioned between the plurality of inputs and the plurality of LNAs, such that each input of the plurality of inputs is communicatively coupled to a corresponding LNA of the plurality of LNAs via a corresponding inductive-matching network of the plurality of inductive-matching networks. The radar sensing system further includes another inductive-matching network adjacent the plurality of LNAs.

In yet another aspect of the present invention, the plurality of inductive-matching networks, the plurality of LNAs, and the another inductive-matching network may be arranged symmetrically with respect to the connection point.

In still another aspect of the present invention, each of the LNAs may be individually activated and deactivated as defined by respective input control signals. The input control signals are configured such that a deactivated LNA has both forward-direction scattering parameter S12 and reverse-direction scattering parameter S21 minimized such that the input coupled to the deactivated LNA is isolated from other inputs.

In a further aspect of the present invention, the radar sensing system may include shunting devices, with a shunting device coupled to each respective input. Each respective shunting device is configured to reduce the magnitude of the S12 parameter when the corresponding LNA is deactivated.

These and other objects, advantages, purposes and features of the present invention will become apparent upon review of the following specification in conjunction with the drawings.

BRIEF DESCRIPTION OF THE DRAWINGS

FIG. 5 is a table illustrating operational and dynamic ranges of various radar systems in accordance with the present invention;

DESCRIPTION OF THE PREFERRED EMBODIMENTS

Figure 1:
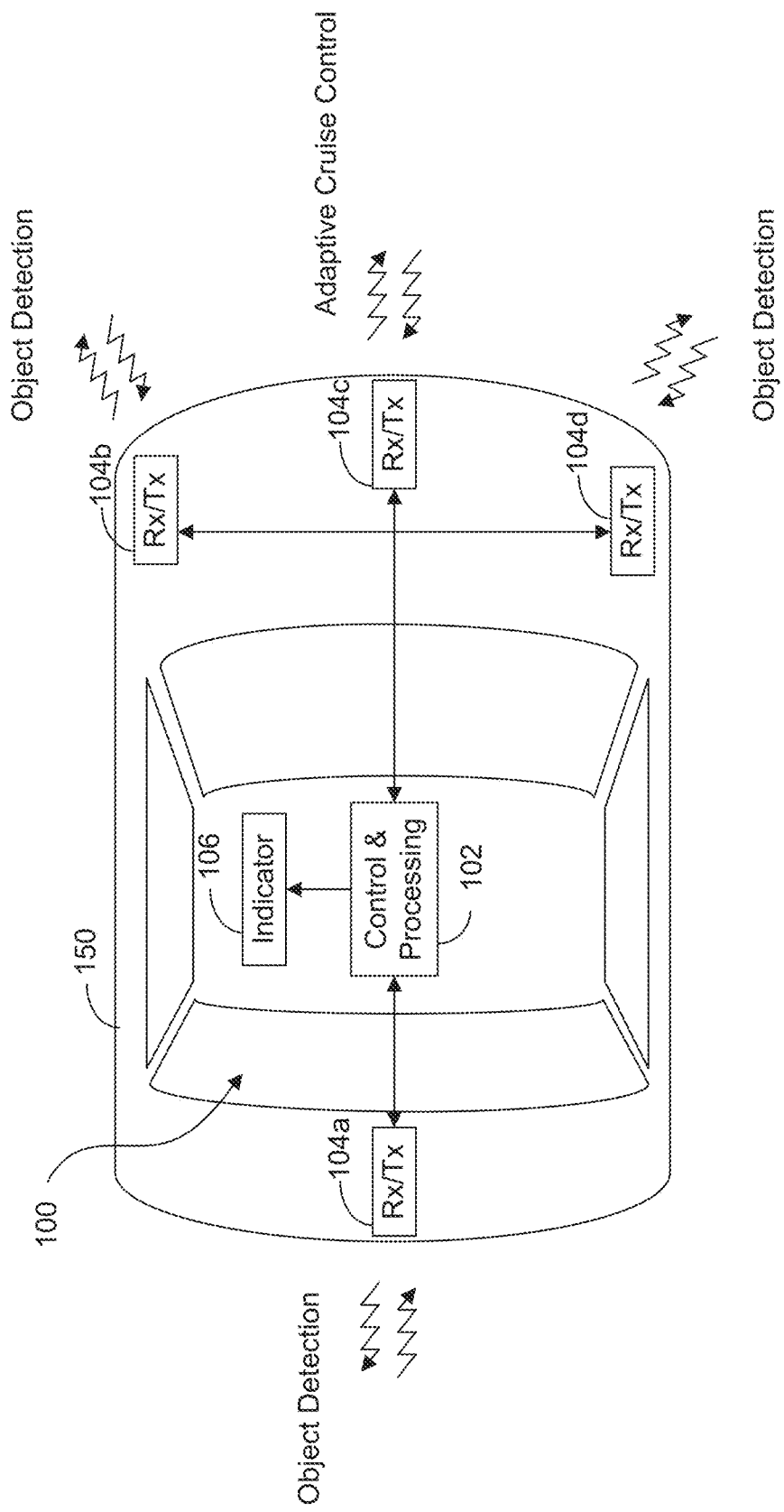
FIG. 1 is a plan view of an automobile equipped with a radar system in accordance with the present invention.

The present invention will now be described with reference to the accompanying figures, wherein numbered elements in the following written description correspond to like-numbered elements in the figures. Methods and systems of the present invention provide for millimeter wave radar systems. Such methods and systems of the present invention provide for a MIMO radar system-on-chip in 28 nm CMOS. Embodiments of the present invention provide for distributing a quadrature local oscillator signal to transmitters and receivers from a single source, such that the phase noise generated is correlated between the transmitters and receivers. In a further embodiment of the present invention, an exemplary millimeter wave radar system includes switched-antenna inputs in low-noise amplifier (LNA) RF front ends without the use of a separate RF switch. In yet another embodiment of the present invention, an exemplary millimeter wave radar system includes multiple-gated transistor LNA non-linear cancellation.

There are several types of signals used in different types of radar systems. A radar system may transmit a continuous signal or a pulsed signal. In a pulsed radar system a signal is transmitted for a short duration during a first time period and then no signal is transmitted for a short duration during a subsequent second time period. This is repeated over and over. When the signal is not being transmitted, a receiver listens for echoes or reflections from objects in the environment. Often a single antenna is used for both a transmitter and a receiver, where the radar transmits with the transmitter on the single antenna and then listens with the receiver, via the same antenna, for a radio signal reflected from objects in the environment. This process is then repeated.

Another type of radar system is known as a continuous wave radar system where a signal is continuously transmitted. There may be an antenna for transmitting and a separate antenna for receiving. One type of continuous radar signal is known as a frequency-modulated continuous waveform (FMCW). In an FMCW radar system, the transmitter of the radar system sends a continuous sinusoidal signal in which the frequency of the signal varies. This is sometimes called a chirp radar system. Mixing (multiplying) the radio signal reflected from a target/object with a replica of the transmitted signal results in a CW signal with a frequency that represents the distance between the radar transmitter/receiver and the target. For example, by measuring the time difference between when a certain frequency was transmitted and when the received signal contained that frequency, the range to an object can be determined. By sweeping up in frequency and then down in frequency, the Doppler frequency can also be determined.

Another type of radar signal is known as a phase-modulated continuous waveform (PMCW). For this type of signal, a phase of a radio signal to be transmitted is varied according to a certain pattern or code, sometimes called the spreading code, and is known at the PMCW radar receiver. The transmitted signal is phase modulated by mixing a baseband signal (e.g., with two values +1 and −1) with a local oscillator to generate a transmitted signal with a phase that is changing corresponding to the baseband signal. Sometimes, the phase during a given time period (called a chip period or chip duration) is one of a finite number of possible phases. A spreading code consisting of a sequence of chips, (e.g., +1, +1, −1, +1, −1, . . . ) that is mapped (e.g., +1→0, −1→π radians) into a sequence of phases (e.g., 0, 0, π, 0, π, π, . . . ), can be used to modulate a carrier to generate the radio signal. The rate at which the phase is modulated determines the bandwidth of the transmitted signal and is called the chip rate.

In a PMCW radar system, the receiver can determine distance to objects by performing correlations of the received signal with time-delayed versions or replicas of the transmitted signal and looks for peaks in the correlations. A time-delay of the transmitted signal that yields peaks in the correlation corresponds to the delay of the transmitted signal when reflected off an object. The distance to the object is found from that delay and the speed of light.

The spreading code (used to phase modulate the radio signal before transmission) could be a periodic sequence or could be a pseudo-random sequence with a very large period so that it appears to be a nearly random sequence. The spreading code could be a sequence of complex numbers. The resulting modulated signal has a bandwidth that is proportional to the rate at which the phase changes, called the chip rate, which is the inverse of the chip duration. By comparing the return signal to the transmitted signal, the receiver can determine the range and the velocity of reflected objects. For a single transmitter, a sequence of chip values that form the code or spreading code that has good autocorrelation properties is required so that the presence of ghost or false targets are minimized.

FIG. 1 illustrates an exemplary radar system 100 configured for use in a vehicle 150. In an aspect of the present invention, a vehicle 150 may be an automobile, truck, or bus, etc. The radar system 100 may utilize multiple radar systems (e.g., 104a-104d) embedded into an automobile as illustrated in FIG. 1. Each of these radar systems may employ multiple transmitters, receivers, and antennas. These signals are reflected from objects (also known as targets) in the environment and received by one or more receivers of the radar system. A transmitter-receiver pair is called a virtual radar (or sometimes a virtual receiver). As illustrated in FIG. 1, the radar system 100 may comprise one or more transmitters and one or more receivers 104a-104d for a plurality of virtual radars. Other configurations are also possible. FIG. 1 illustrates the receivers/transmitters 104a-104d placed to acquire and provide data for object detection and adaptive cruise control. As illustrated in FIG. 1, a controller 102 receives and the analyzes position information received from the receivers 104a-104d and forwards processed information (e.g., position information) to, for example, an indicator 106 or other similar devices, as well as to other automotive systems. The radar system 100 (providing such object detection and adaptive cruise control or the like) may be part of an Advanced Driver Assistance System (ADAS) for the automobile 150.

Figure 2A:
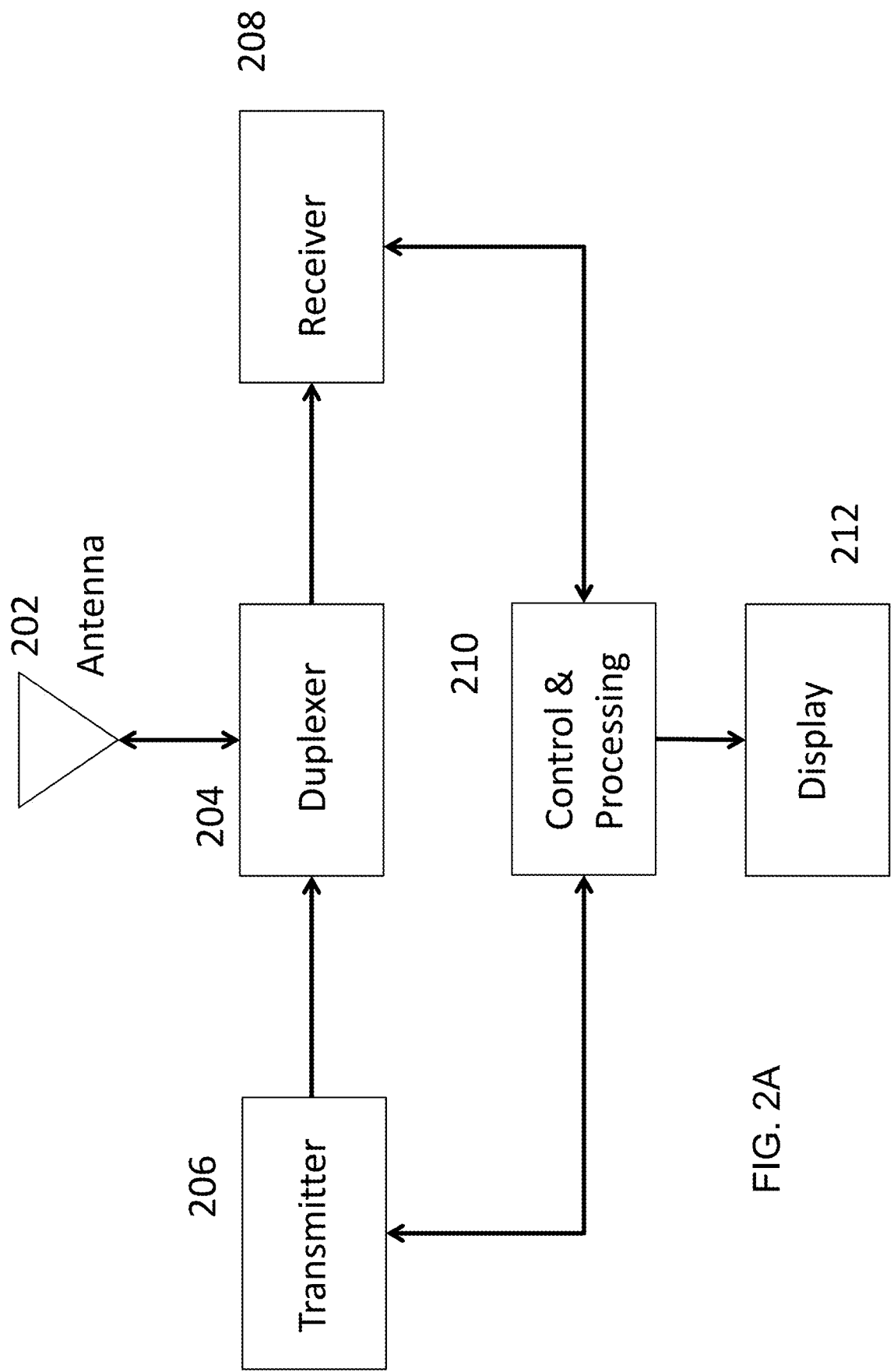
FIG. 2A and FIG. 2B are block diagrams of a single transmitter and a single receiver in a radar system.
Figure 2B:
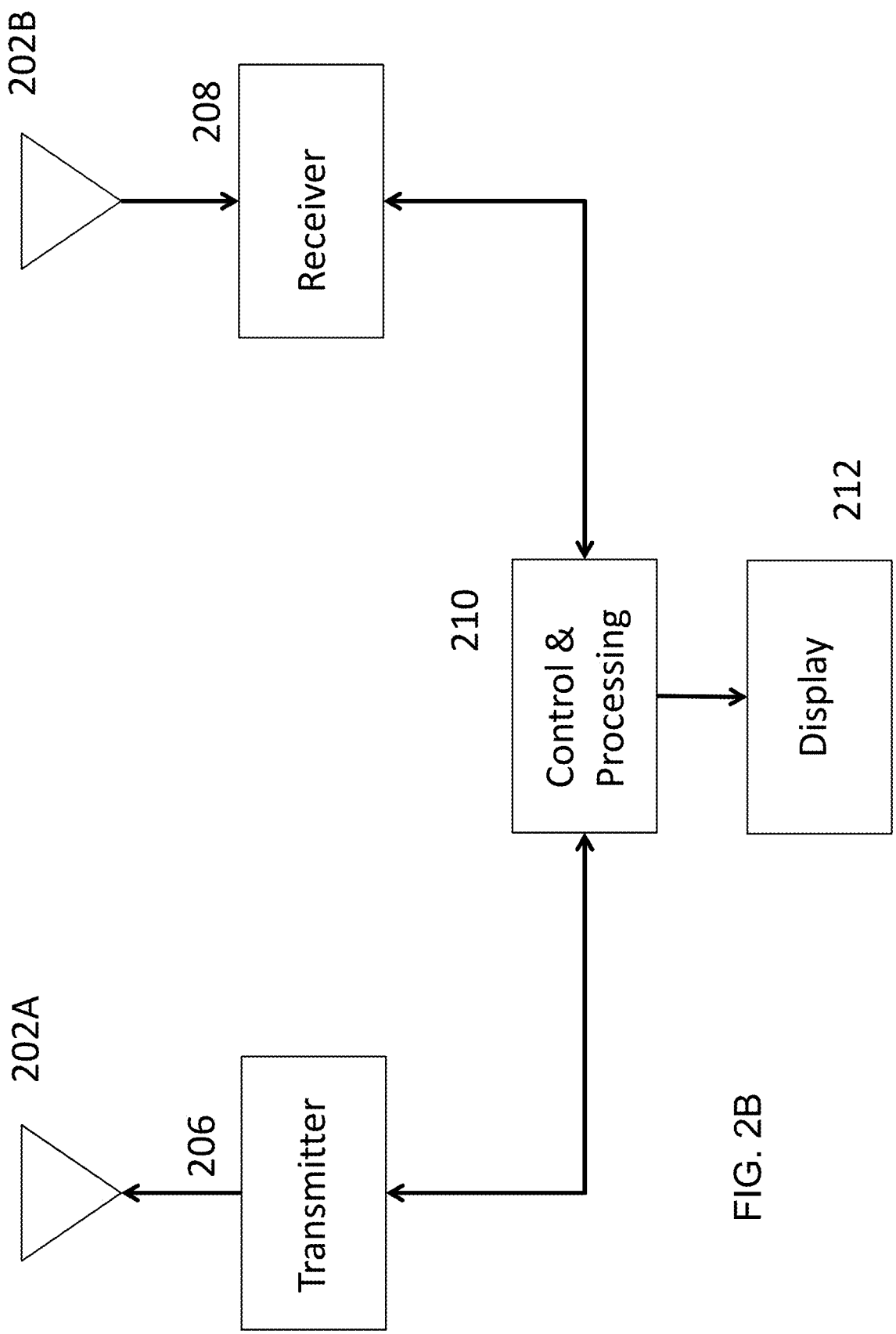

There are several ways to implement a radar system. One way, illustrated in FIG. 2A uses a single antenna 202 for both transmitting and receiving radio signals. The antenna 202 is connected to a duplexer 204 that routes the appropriate signal from the antenna 202 to a receiver 208 or routes the signal from the transmitter 206 to the antenna 202. A processor 210 controls the operation of the transmitter 206 and the receiver 208 and estimates the range and velocity of objects in the environment. A second way, illustrated in FIG. 2B, uses a pair of antennas 202A, 202B for separately transmitting and receiving, respectively. A processor 210 performs the same basic functions as in FIG. 2A. In each case there may be a display 212 to visualize the location of objects in the environment.

Figure 3:
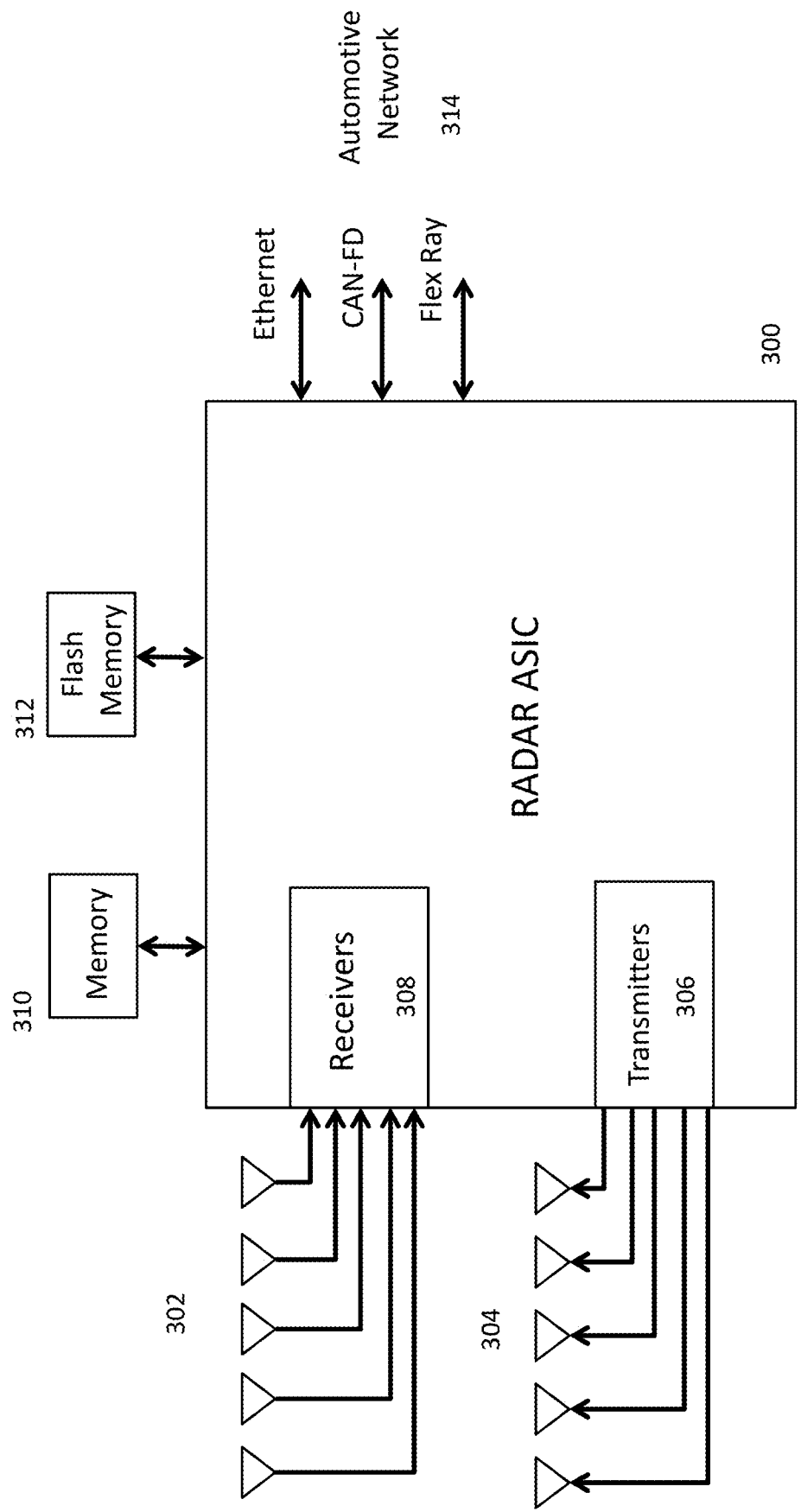
FIG. 3 is a block diagram of a radar system with multiple transmitters and multiple receivers.

A radar system with multiple antennas, transmitters, and receivers is illustrated in FIG. 3. Using multiple antennas 302, 304 allows the radar system 300 to determine an angle (azimuth or elevation or both) of targets in the environment. Depending on the geometry of the antenna system, different angles (e.g., azimuth or elevation) can be determined.

The radar system 300 may be connected to a network via an Ethernet connection or other types of network connections 314, such as, for example, CAN-FD and FlexRay. The radar system 300 will have memory 310, 312 to store software and data used for processing the radio signals in order to determine range, velocity and location of objects. Memory 310, 312 can also be used to store information about targets in the environment. There may also be processing capability contained in the ASIC 300 apart from the transmitters 306 and receivers 308.

Figure 4:
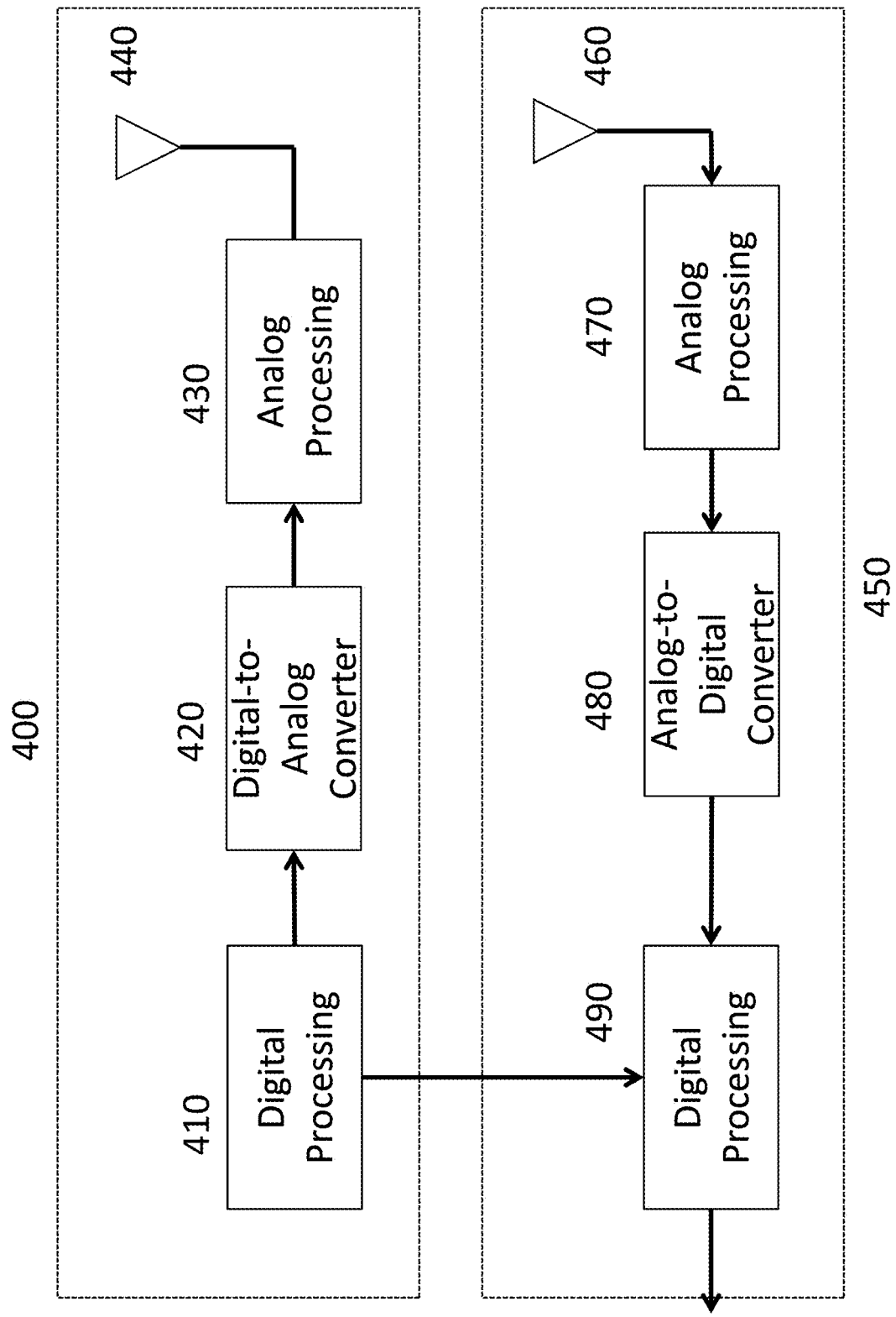
FIG. 4 is a block diagram illustrating the basic processing blocks of a transmitter and a receiver in a radar system in accordance with the present invention.

A basic block diagram of an exemplary PMCW system with a single transmitter and a single receiver is illustrated in FIG. 4. The transmitter 400 consists of a digital processor 410, which includes a digital signal generator. The digital processor 410 output is the input to a digital-to-analog converter (DAC) 420. The output of the DAC 420 is up-converted to an RF signal and amplified by an analog processing unit 430. The resulting upconverted and amplified radio signal is then transmitted via antenna 440. The digital signal generator of the digital processor 410 is configured to generate a baseband signal. An exemplary baseband signal might consist of repeated sequences of random or pseudo-random binary values for one transmitter, e.g., (−1, −1, −1, −1, 1, 1, 1, −1, 1, 1, −1, −1, 1, −1, 1), although any sequence (including non-binary sequences and non-periodic sequences) could be used, and different sequences could be used for different transmitters. Each value of the sequence is often called a chip. A chip would last a certain length of time called a chip duration. The inverse of the chip duration, denoted by $T_c$, is the chip rate, denoted by $R_C$. The sequence of chips could repeat every $L_c$ chips in which case the sequence is said to be periodic and $L_c$ is said to be the length or period. In an exemplary aspect of the present invention, the sequences of random binary values may be provided by a truly random number generator or by a combination of the truly random number generator and a pseudorandom number generator. The use of a truly random number generator and a pseudorandom number generator are explained in more detail in U.S. Pat. No. 9,575,160, which is hereby incorporated by reference herein in its entirety. The receiver 450, as illustrated in FIG. 4, consists of a receiving antenna 460, an analog processing unit 470 that amplifies the received signal and mixes the signal to a baseband signal. This is followed by an analog-to-digital converter (ADC) 480 and then a digital processor 490 which provides digital baseband processing. There is also a control processor (not shown) that controls the operation of the transmitter 400 and the receiver 450. The baseband processing will process the received signal and may generate data that can be used to determine range, velocity and angle of objects in the environment.

The receiver in a radar system that uses phase-modulated continuous wave (PMCW) signals correlates the received signal with delayed versions of the transmitted signal. Here the "received signal" is a received radio signal that is down-converted, sampled and quantized (i.e., the signal at the input of the digital processing module 490 of the receiver 450), while the "transmitted signal" is a baseband version of the original transmitted signal (i.e., the signal from the digital processor 410 communicated to the digital processing module 490 in the radar system). An object at a certain distance will reflect the transmitted signal and the reflected signal will arrive at the receiver with a delay that corresponds to a propagation delay between the radar transmitter, the object, and the radar receiver.

The radar sensing system of the present invention may utilize aspects of the radar systems described in U.S. Pat. Nos. 9,971,020; 9,869,762; 9,846,228; 9,806,914; 9,791,564; 9,791,551; 9,772,397; 9,753,121; 9,599,702; 9,575,160, and/or 9,689,967, and/or U.S. Publication Nos. US-2017-0309997; US-2017-0307728, and/or US-2017-0310758, and/or U.S. patent application Ser. No. 15/496,038, filed Apr. 25, 2017, Ser. No. 15/689,273, filed Aug. 29, 2017, Ser. No. 15/893,021, filed Feb. 9, 2018, and/or Ser. No. 15/892,865, filed Feb. 9, 2018, and/or U.S. provisional applications, Ser. No. 62/486,732, filed Apr. 18, 2017, Ser. No. 62/528,789, filed Jul. 5, 2017, Ser. No. 62/573,880, filed Oct. 18, 2017, Ser. No. 62/598,563, filed Dec. 14, 2017, Ser. No. 62/623,092, filed Jan. 29, 2018, and/or Ser. No. 62/659,204, filed Apr. 18, 2018, which are all hereby incorporated by reference herein in their entireties.

Analog Correlators

In an exemplary embodiment, analog correlators are used to mitigate interference. The challenge of mitigating radar interference is complicated when automobiles utilize multiple radar systems. For example, a single vehicle may utilize a forward facing, long-range radar (LLR) operating at an exemplary 76.5 GHz and a mid-range radar (MRR) operating at an exemplary 76.5 or 79 GHz. The same vehicle may also utilize a rear-facing multi-mode radar operating at an exemplary 79 GHz, and corner, short-range radars (SRR), operating at an exemplary 79 GHz. In bumper-to-bumper traffic conditions, forward- and rear-facing radars of different vehicles (one behind the other) may be transmitting into one another at point-blank range. There are other interference challenges as well. For example, automotive radars may interact in different ways, e.g., FMCW-on-FMCW, FMCW-on-PMCW, and scanned-beam-on-MIMO.

Radar manufacturers can prevent self- or like-type interference through judicious engineering. For example, by (i) managing radar beamwidth and power, (ii) coordinating antenna polarizations and/or band segmentation, and (iii) offsetting FMCW chirps or orthogonalizing PMCW codes. However, in the absence of standards, new market entrants can negate these efforts.

In an exemplary embodiment, a radar architecture for a phase-modulated, continuous wave radar includes coded BPSK waveform, similar to CDMA, and GPS, with an occupied bandwidth depending upon a modulation rate, e.g., LRR (76.25-76.75 GHz), MRR (78.5-79.5 GHz), and SRR (77.5-80.5 GHz). Interference susceptibility will be dependent upon code type.

The exemplary radar system may utilize an MIMO antenna array, with low equivalent isotropically radiated power (EIRP) (~5 dBW), digital beamforming, channel orthogonality dependent upon code type, about a 70 cm$^2$ combined aperture, and a larger distributed aperture possible in the future. The exemplary radar system may include front, corner, and rear-facing radars that include high-end and mass market radars using single chip transceiver arrays. Exemplary dynamic range requirements of the exemplary radar system are illustrated in FIG. 5.

A corresponding blinding distance for radar-to-radar interference may be determined using the following equations:

$$\text{Radar equation: } \dots P_r = \frac{P_t G_t G_r \lambda^2 \sigma}{(4\pi)^3 R^4}$$

$$\text{Radio link budget equation} \dots P_r = \frac{P_t G_t G_r \lambda^2}{(4\pi)^2 R^2}$$

$$\text{For radar at max end of dynamic range} \dots P_r = \frac{P_t G_t G_r \lambda^2 \sigma_{max}}{(4\pi)^3 R_{min}^4}$$

Equating this fixed level to power from interferer (radio):

$$\frac{4\pi R_{min}^4}{\sigma_{max}} = R^2; R = \sqrt{\frac{4\pi}{\sigma_{max}}} R_{min}^2$$

Therefore:
Taking $\sigma_{max}=10^4$ m$^2$ and $R_{min}=50$ m (LRR), R=88.6 m
⇒ for R<88.6 m, power from oncoming radar exceeds LRR dynamic range limit Therefore, for blinding overhead requirements:
LRR antenna beam covers +/−19 degrees from centerline.
An exemplary lane is 5 meters wide.
Oncoming cars "pass" at 5 meters/tan (19 degrees)=14.5 meters. This is considered to be the closest approach for the interferer.

The radio equation again:

$$P_r = \frac{P_t G_t G_r \lambda^2}{(4\pi)^2 R^2}$$

The power received at 14.5 meters, relative to power received at 88.6 meters (max dynamic range) is:
(88.6/14.5)$^2$=37.3=15.7 dB Therefore, a 16 dB margin is needed for radar-to-radar interference blinding from oncoming traffic.

When considering FMCW-to-PMCW interference signals, other LRR FMCW signals may impact an analog front-end and an analog-to-digital (A/D) of the receiver. The FMCW signal may be considered a single tone of up to −15 dBm signal at 1 meter distance, with the same power as the subject radar is transmitting. At about 90 meters, loss of sensitivity for the smallest radar cross section (RCS) starts. The FMCW tone raises the noise floor where the smallest signals are no longer detectable.

Therefore, increasing the dynamic range of the radar system by 16 dB is necessary. Adding another 18 dB of dynamic range can be achieved with 64 analog correlators (2$^6$ or 18 dB of additional dynamic range). With both analog correlators and three more bits of resolution in the A/D, the interference may get down to 2 meters of interference, which would take care of a rear-facing radar blinding a forward-facing radar.

Analog correlators allow configurable banks of powers of two, allowing for the switching in 2 dB more of dynamic range. Every 2× in correlators gives ½ a bit more information on the correlators. In one embodiment, correlators could have different codes between the virtual receivers, but would require 64× the number of correlators and as 128× the A/D that would be otherwise used. This would also require 3 extra bits by the A/D. In another exemplary embodiment, the signals could be transmitted using a same inner code on all transmitters, but there would be some loss of angular accuracy.

Therefore, in an exemplary embodiment, a trade off in angular accuracy is achieved by sharing the same inner code on all transmitters, reducing resolution (a lower chip rate), and a lower bit accuracy requirement for whatever is achieved at the lower A/D sample rate with current A/D's. For example, an exemplary embodiment includes:
Reducing the chip rate to 500 Mchips.
Integrating 2-64 chips (as high as possible, in one embodiment, there are 16 or 32 analog correlators) with the same inner code on each transmitter, allowing for an A/D sampling at 500 Mchips per second interleaved on 2-64 analog correlators. This is configurable in powers of 2. This will keep the same number of A/D's, but allow for operation during blinding situations.

Figure 6:
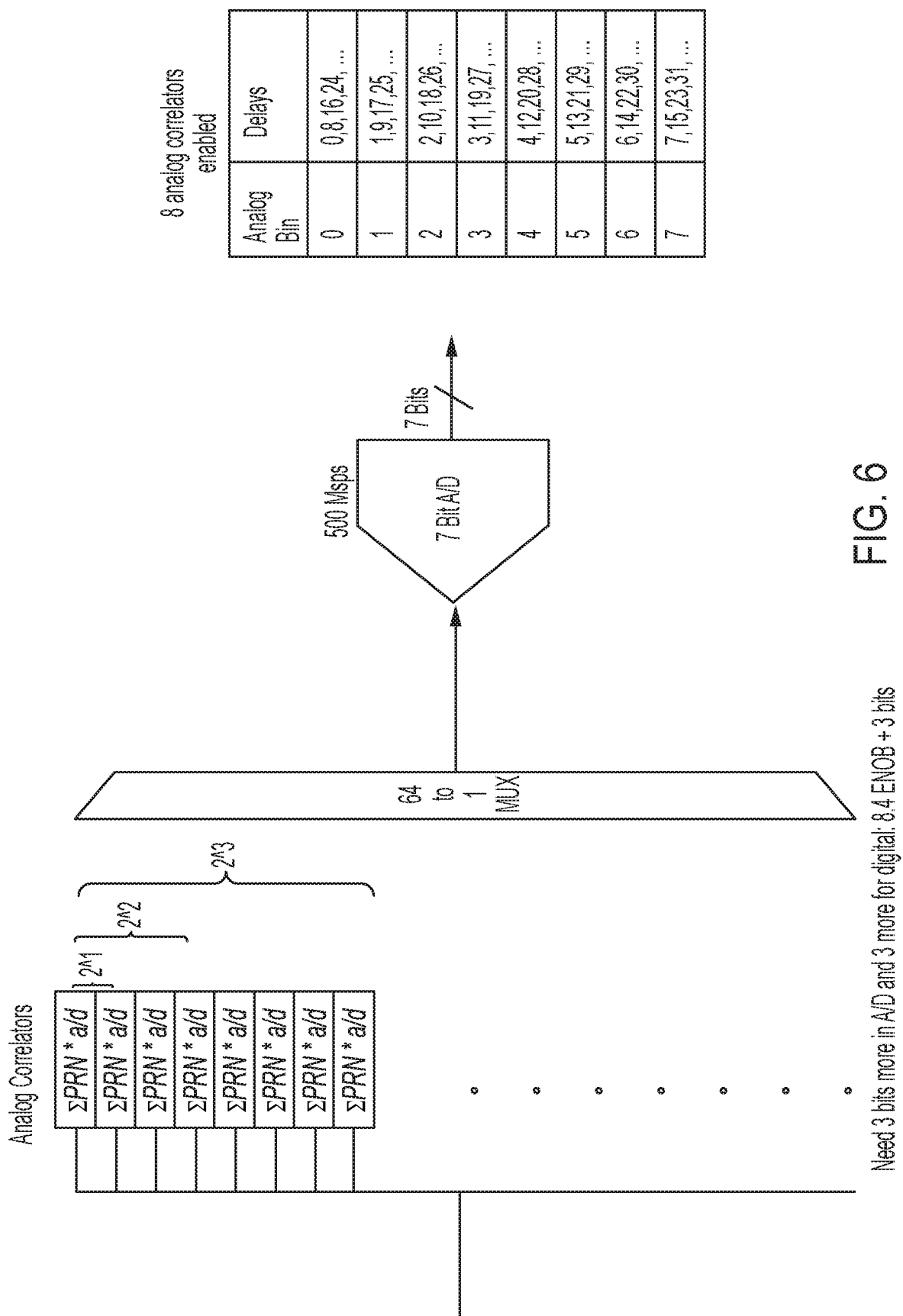
FIG. 6 is a block diagram illustrating correlators of a radar system in accordance with the present invention.

FIG. 6 illustrates exemplary analog correlators. In one exemplary embodiment, the analog output bins could be added up together in the digital domain for 6 more bits of precision added for 64 analog range bits. This would simplify the distribution of the data, but would require digital accumulators to handle 13 bit numbers on the ingress. This would also complicate the multiplication for the variable range bins, but is likely the simplest mechanism. In one exemplary embodiment, only 3 extra bits or 10 MSB bits for the 64 analog output bins is used, if the resolution of the A/D isn't changed. If the A/D resolution is fixed to 8.4 ENOB, and 3 bits are added, there would be a need for 11.4 bits or 12 bits.

Additional Requirements for Analog Correlators:

PRN (Code Generation):

An exemplary pseudo random number (PRN) needs to be composed of both an inner and output code. The inner code (fast chip rate) will be targeted to the analog correlators. These will be the same for all transmitters. If the codes are generated with PRBS, there can be two PRBS generators per transmitter. The inner code would have the same seed in all transmitters and the outer code generator would have different seeds in all transmitters that offset in time by more than 64 k. Note, it is desirable to also generate complementary codes in the PRN. This might require memory or some new generators. It may be desirable to switch between codes scan by scan.

Sensing Circuit:

A frequency sensing circuit with a knowledge of the absolute gain is needed. This will enable identifying how much interference suppression is needed. Since enabling analog correlators will impact the range resolution, angular accuracy, and gain, it is desirable to only put it in place when absolutely needed.

A/D Output:

A/D output data increases to 8.4 bits ENOB. Due to adding all the analog range bins back together in the digital domain, the number of bits increases to 8.4 (64 analog correlators $2^6 \rightarrow 6/2=3$, assuming 5.4 now).

Additional requirements on digital correlators of 8.4+3 bits or 11.4 bits.

78-81 GHz 192 Virtual Receivers GMSK MIMO Radar System-on-Chip in 28 nm CMOS:

In one embodiment of the present invention, an exemplary 76-to-81 GHz MIMO radar may comprise 2×8 receivers and 12 transmitters, resulting in an up to 192 virtual antenna array. An exemplary transmitter generates pseudo-random-noise (PRN) orthogonal codes and modulates them using a Gaussian minimum-shift-keying (GMSK) modulation scheme, to maximize the allowed output power within the spectral mask requirements. An exemplary receiver features a continuous wave (CW)-cancellation architecture that makes it resilient to self-interference. The radar transceiver, signal processor, and processors are fully integrated in a CMOS 28 nm technology. The embedded wafer level (eWLP) packaged radar achieves a combined +21.8 dBm max transmitter EIRP, 13 dB receiver NF, and −5 dBm receiver iP1 dB when the analog and digital cancellation units are active. At the system level, the 8×8 configuration achieves 0.95 degree angular resolution in an anechoic chamber, and 15 dB SNR at 300 m in the field.

As discussed herein, MIMO radars rely on transmitting arbitrary waveforms on multiple physical antennas: from an array of N TXs and K RXs, it is possible to implement a virtual antenna of K×N elements which ultimately results in a larger aperture as well as improved immunity to interference. Fully integrated millimeter wave (also known as mmWave or mm-wave) radar transceivers can be used to implement up to 12 VRxs and can be expanded to larger time-domain MIMO arrays only by relying on costly PCB-based implementations. In one embodiment, an exemplary single-chip code-domain MIMO radar is capable of processing up to 192 VRx: the system-on-chip (SoC), including the mm-wave phased-array transceiver, the digital front-end, the processors, and interfaces, is fully integrated in a 28 nm CMOS technology, achieving one of the highest levels of integration to date.

Figure 7:
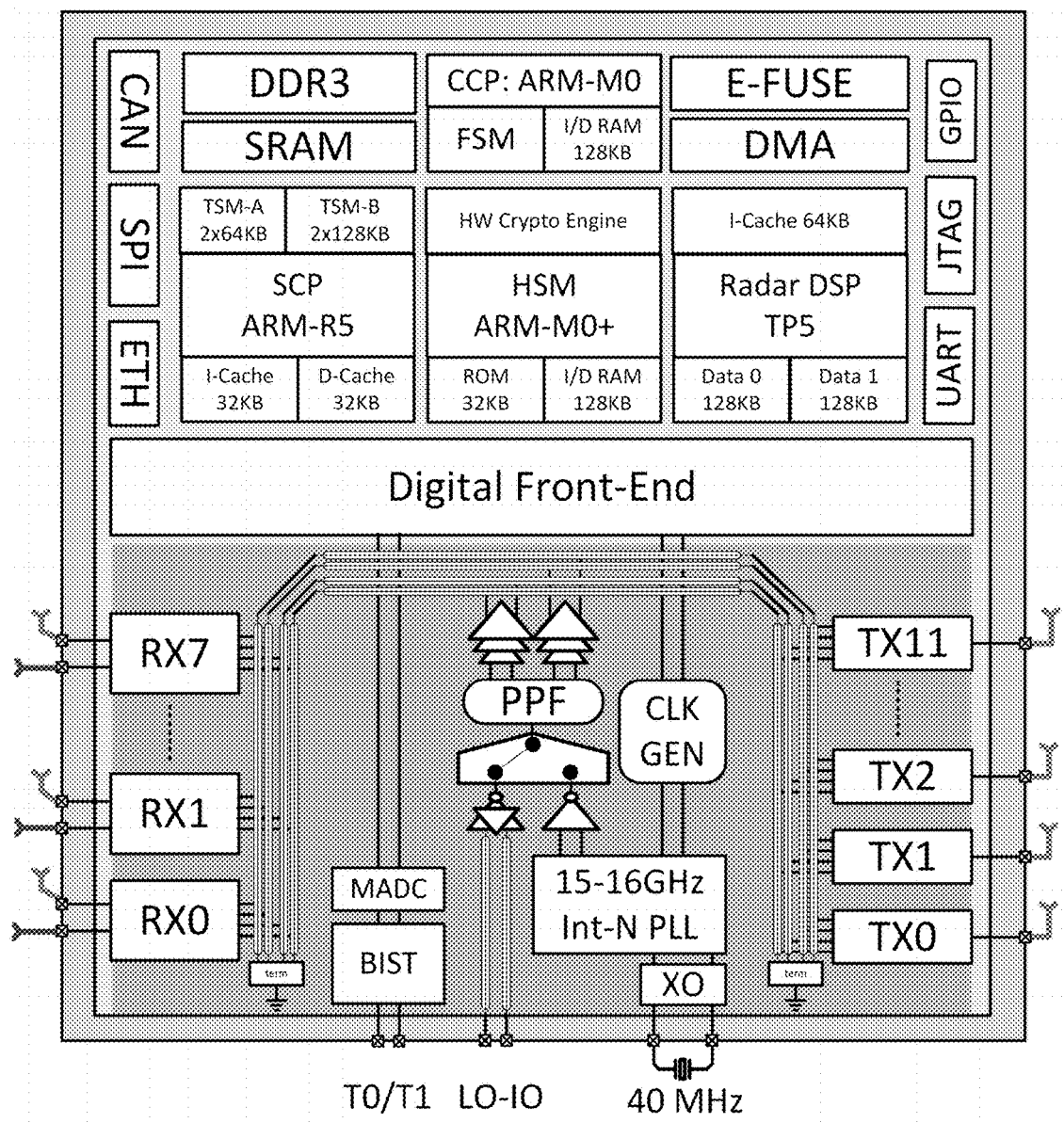
FIG. 7 is a block diagram of a radar system-on-chip of a radar system in accordance with the present invention.

Radar System-on-Chip (SoC):

FIG. 7 illustrates a block diagram of a proposed radar SoC. Fully-orthogonal PRN codes are modulated by using a digital GMSK modulator, which allows the radar system to maximize the output power in both the 76-77 GHz and 77-81 GHz bands while complying with the ETSI spectral mask requirements. This is a key advantage compared to conventional BPSK radar implementations. Compared to FMCW radars, exemplary PMCW radars rely on a simpler analog architecture shifting the modulation complexity mostly to the digital domain, where performance scales with the CMOS technology. The 76-to-81 GHz radar transceiver (TRX) is made of 12 TXs and 8 RXs, the latter of which are multiplexed to 2 sets of antennas to get coverage of both azimuth and elevation profiles. The local oscillator (LO) signal is generated by an on-chip 15-16 GHz integer-N PLL. Alternatively, an external LO can be used when a range in excess of 300 m is needed or if a daisy chain configuration is desired. The differential PLL output is converted to quadrature by using a polyphaser filter (PPF), whose output is buffered and distributed to all Tx/Rx channels with a differential 100Ω terminated transmission line. Each channel relies on sub-harmonic quadrature injection locked oscillators (SH-QILO) to generate the mm-wave carrier.

All the digital processing may be enabled on the same chip by two exemplary ARM R5F CPUs (up to 800 MHz) with floating point support and one Tensilica P5 DSPs (666 MHz). The radar SoC has RF-BIST capabilities enabled by an analog-probe bus, dc and mm-wave monitoring circuitry, and a sigma-delta monitor ADC. Multiple interfaces are supported including Gbps Ethernet and a DDR3 interface. The overall configurable hardware pipeline is capable of up to 20 Tera Ops baseband processing.

Figure 8:
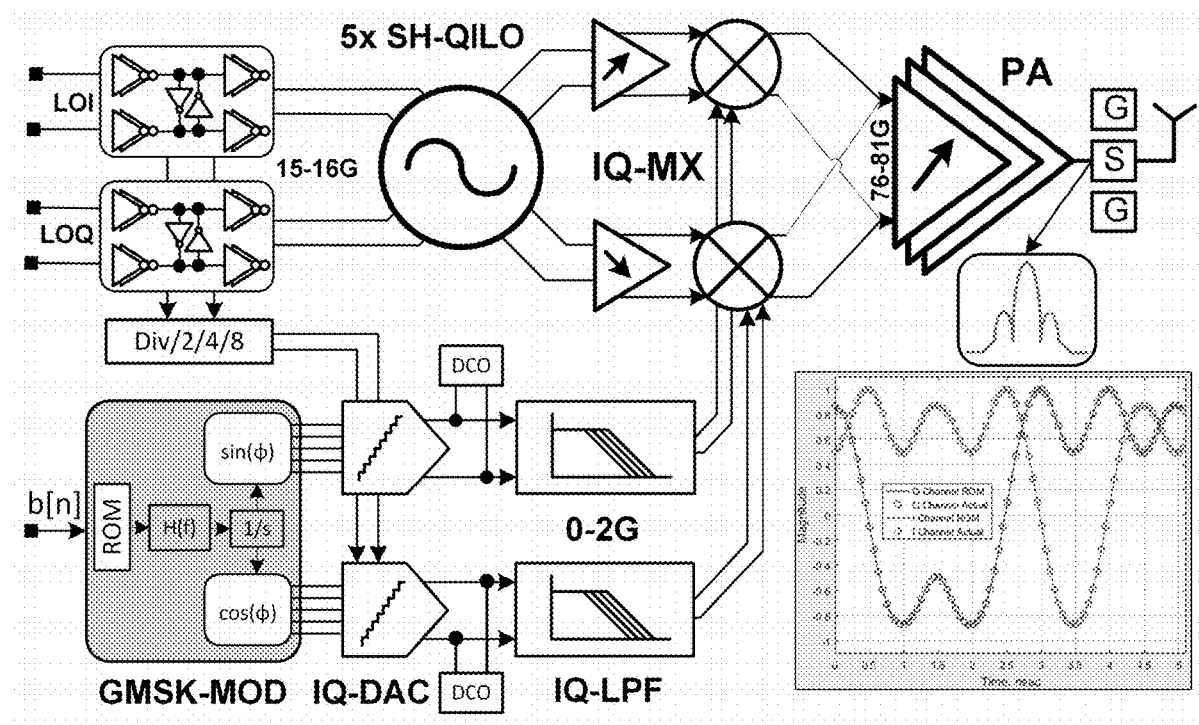
FIG. 8 is a block diagram illustrating quadrature GMSK transmitter architecture of a radar system in accordance with the present invention.
Figure 9:
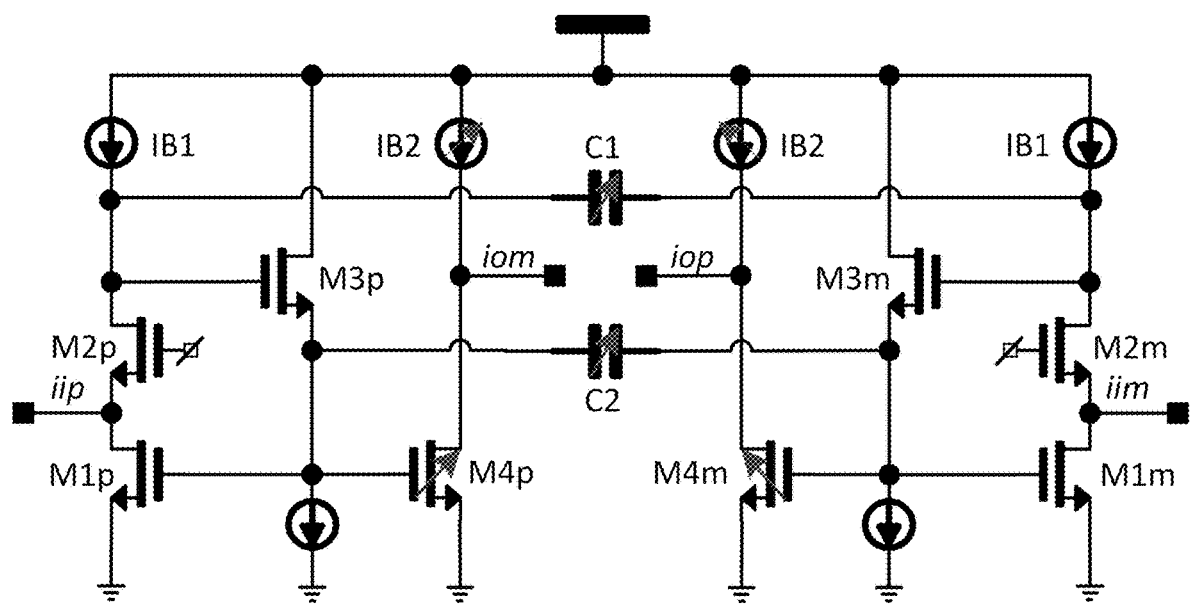
FIG. 9 is a schematic of a power-amplifier stage of a radar system of a radar system in accordance with the present invention.

The Transmitter:

Bi-phase modulation translates into a constant envelope modulated signal at mm-wave and allows the use of energy-efficient power-amplifiers. However, due to large adjacent frequency sidelobes, conventional BPSK radar implementations only marginally fulfill the ETSI spectral mask regulations in the 76-77 GHz band when a larger output power is required. FIG. 8 illustrates the architecture of the proposed transmitter: a GMSK digital modulator feeds a zero-IF quadrature and up-converts the modulated wideband signal to the mm-wave band of interest. A programmable code (Golay, Gold, APAS, Barker, etc.) is generated and loaded into a ROM table for both I and Q channels, which are then processed by a Gaussian filter and an integrator, both sampled up to 8 GHz. The $\sin(\varphi)$ and $\cos(\varphi)$ (whose time-domain waveforms are shown in FIG. 8) are then fed to a current-steering 8 bit DAC. The DAC current output is amplified and filtered by a current-mode wideband biquadratic cell. As the modulated signal is not constant envelope at baseband yet, the linearity of such biquad is critical to achieve the desired spectral mask performance. FIG. 9 illustrates the actual implementation: transistors $M_{1p/m}$, $M_{2p/m}$ and $M_{3p/m}$ form a high loop-gain negative feedback which translates into a low input impedance at nodes iip and iim. The gm-C biquad is fully programmable in terms of cut-off frequency (0.35-to-3 GHz) and current gain (0-to-14 dB), while not affecting the wide-band linearity performance.

Figure 10:
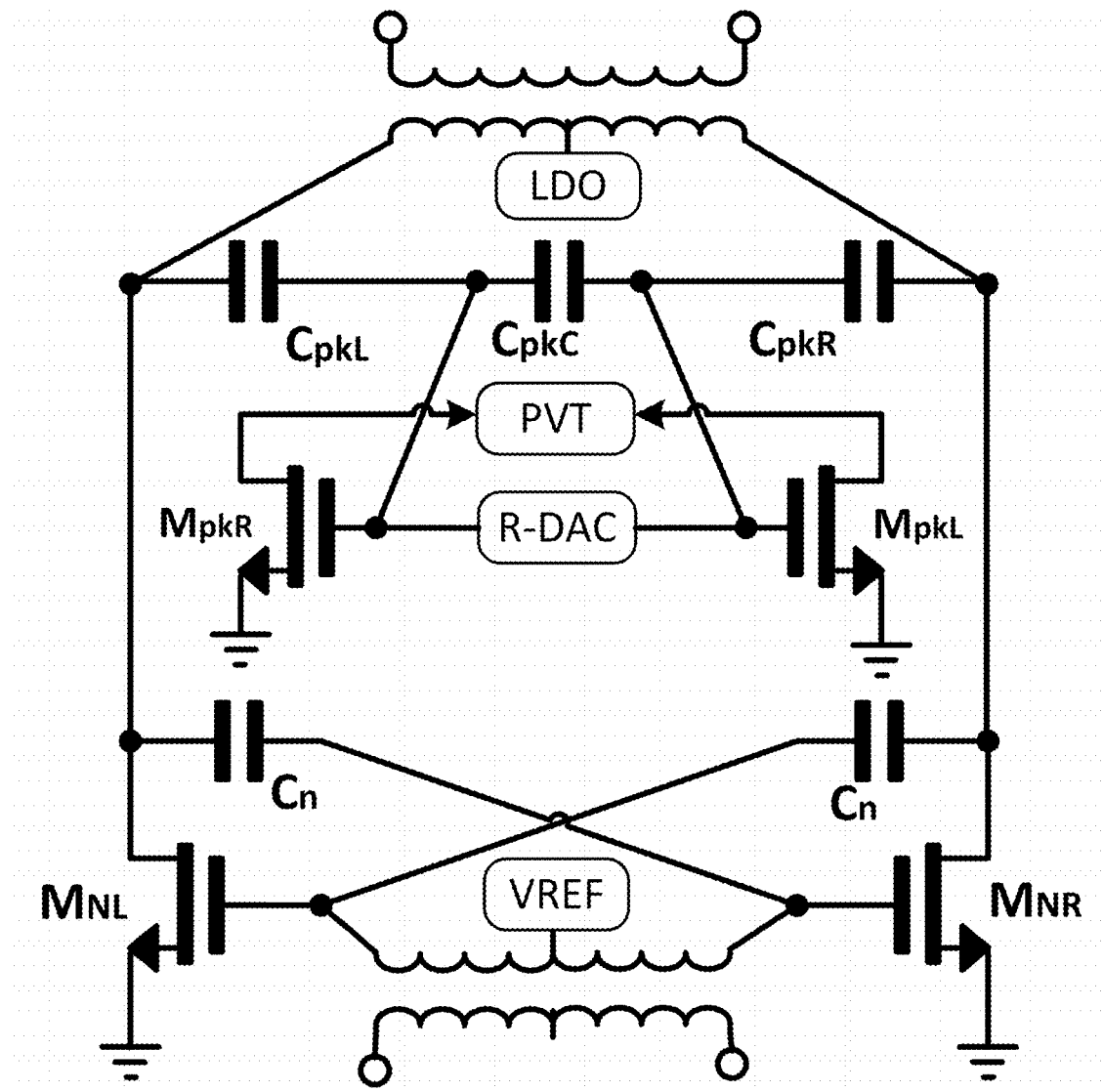
FIG. 10 is a schematic illustrating stages of an LDO of a radar system in accordance with the present invention.

The up-conversion mixer is an exemplary Gilbert cell which takes the current output of the baseband amplifier and multiplies it by the 76-81 GHz carrier generated by the SH-QILO. The power-amplifier is a cascade of mm-wave neutralized transformer-coupled amplifiers biased in class-AB. As illustrated in FIG. 10, each stage features a programmable LDO and voltage reference as well as a peak-detector, whose current output is linearized and made temperature independent, achieving a 10.5 relative accuracy.

Figure 11:
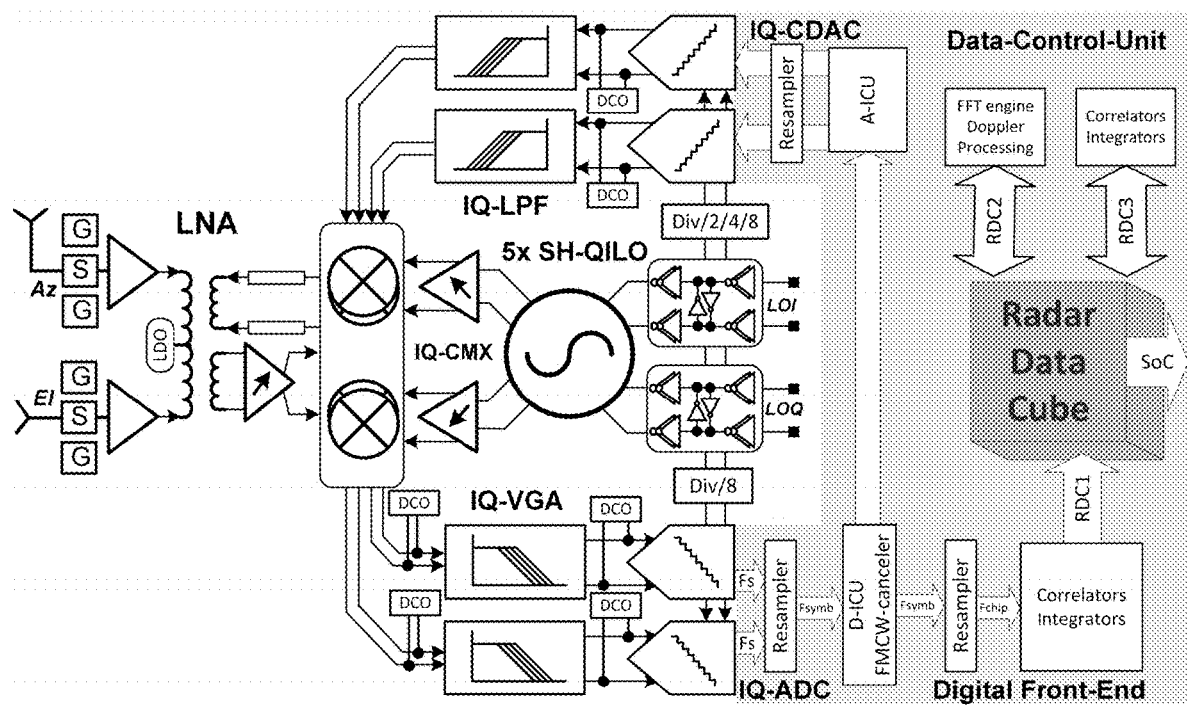
FIG. 11 is a block diagram illustrating receiver architecture of a radar system in accordance with the present invention.

An exemplary receiver (illustrated in FIG. 11) is based on a direct IQ down-conversion architecture followed by an 8-bit 2 GSPS SAR ADC and a digital front-end, which tackles the interference handling as well as the radar data cube computations, including correlation, Doppler, and beam-forming. The first LNA stage can be multiplexed to different antenna inputs minimizing the losses (when ON) and maximizing isolation (when OFF). LNA and mixer need to tackle a large CW self-interference coming from the own TX, which is active at the same time. The interferer not only may saturate the RX, but it translates into range side-lobes which increase the correlation noise floor. This challenge is even more stringent in MIMO radars where multiple TX active channels may constructively sum up at specific RX inputs. An exemplary CW RF canceler is proposed that estimates the complex sum of the wideband CW signal presented at each receiver input and cancels it at the output of the first LNA stage so relaxing the linearity requirements of the following stages. The cancellation path features a 10-bit linear DAC, as well as a −60 dBc im3 up-converter. In addition to that, the digital interference cancellation unit (D-ICU) further reduces the range side-lobes due to the un-canceled CW TX coupling and is capable of canceling up to 10 FMCW blockers within a 1 GHz band. The incoming power from the 2 multiplexing LNAs, and the cancellation path are combined into a multilayer transformer with minimal impact on the RX noise figure.

The radar data control unit can process up to 1024 range bins for a single radar scan. The configurable FFT engine can manage up to 800 million points/second Doppler throughput. The beam-forming engine throughput is about 1.6 billion-beams/second, but also implements a multiple signal classification (MUSIC) to further improve the angular resolution.

Figure 12:
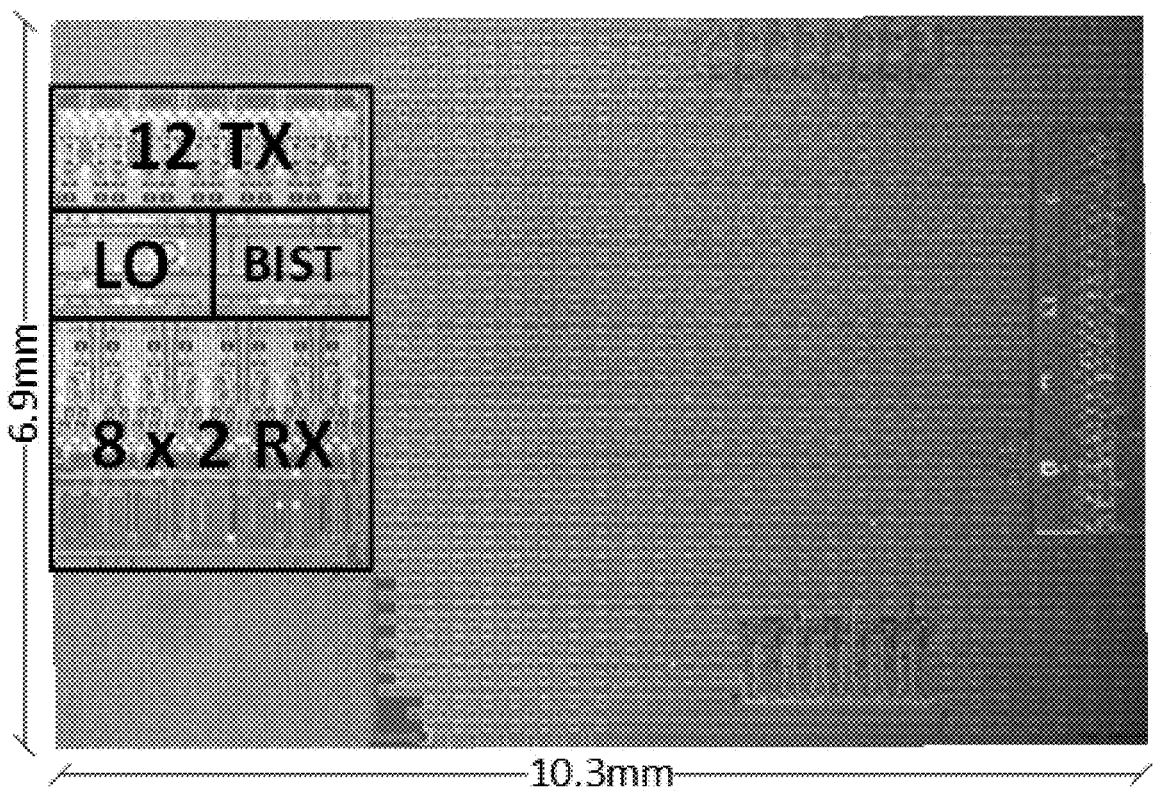
FIG. 12 is a microphotograph of a radar system-on-chip in accordance with the present invention.
Figure 13:
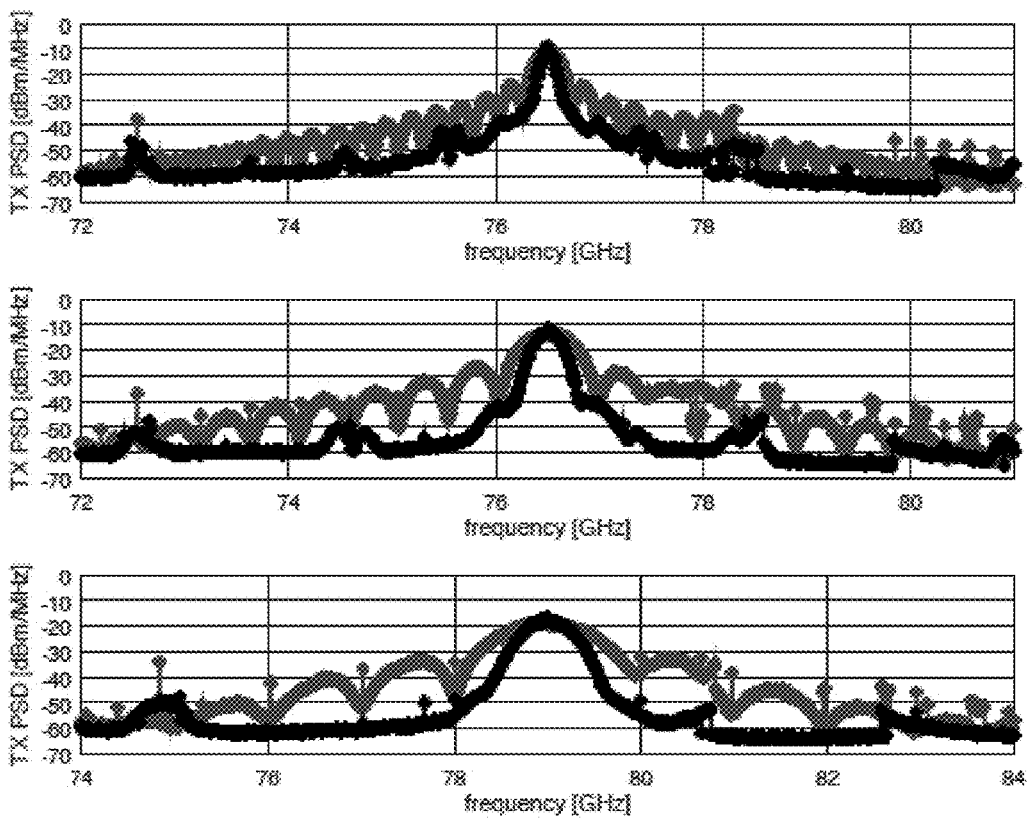
FIG. 13 is a plot illustrating GMSK versus BPSK modulated outputs for different chip rates, carrier, and sampling frequency of a radar system in accordance with the present invention.

The exemplary radar SoC may be implemented in a CMOS 28 nm HPM technology and packaged in a fan-out wafer-level package. An exemplary die photomicrograph is illustrated in FIG. 12. The exemplary SoC occupies 71 mm$^2$ whereas the mm-wave transceiver itself measures 14 mm$^2$. The mm-wave RF characterization was performed on a Megtron-7 test PCB with WR12 waveguide interfaces for each TX and RX channel. PCB losses have been characterized on separate test structures using a test package, so that they can be de-embedded from the TRX measurements. A summary of the key mm-wave performance is provided in I. At the package output reference plane, the TX output power is about +11 dBm, which translates in 21.8 dBm combined EIRP when 12 TX are active at the same time. The RX NF measured at the ADC output is about 13 dB. The radar can run out of the internal LO, whose phase-noise at 1 MHz offset is −86 dBc/Hz and corresponds to about −20 dBc integrated phase-noise within the correlation bandwidth (500 kHz-100 MHz), which is the most relevant metric for PMCW radars. FIG. 13 illustrates 3 different modulated spectrums for 250 MHz, 500 MHz, and 1 GHz occupied bandwidth respectively. In each plot, a conventional BPSK modulated spectrum is compared versus the proposed GMSK, showing an improvement of about 15 dB in the out-of-band spurious performance.

Figure 14:
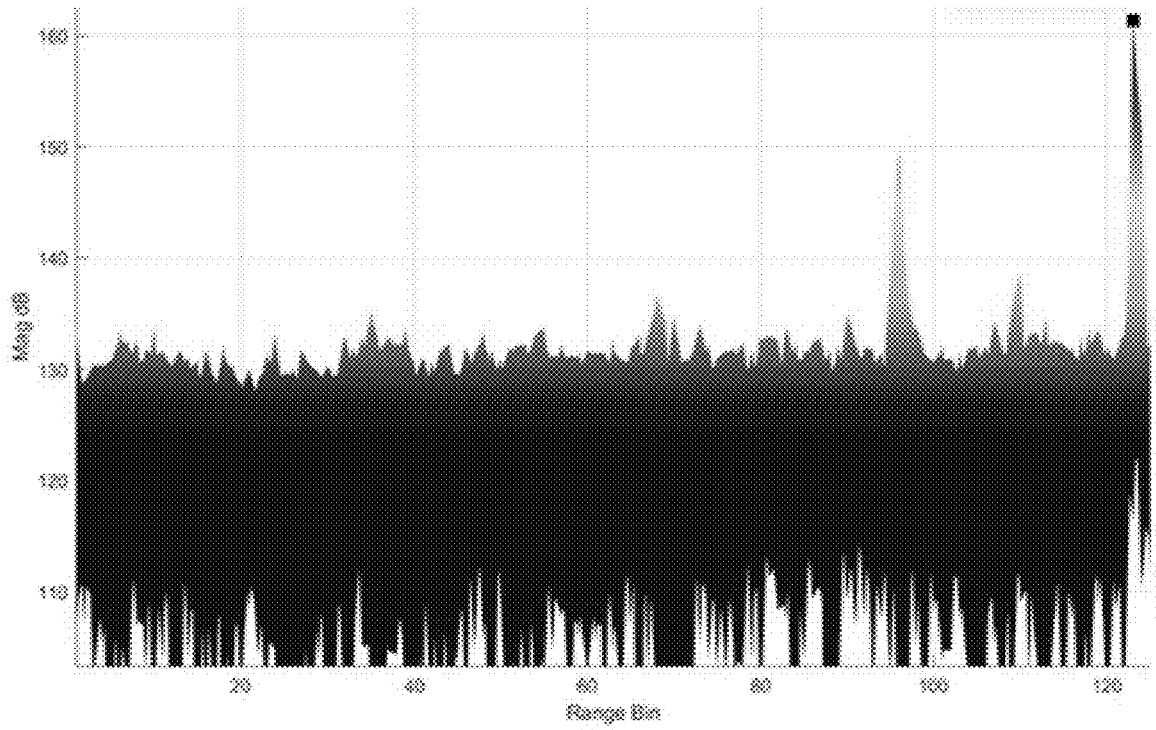
FIG. 14 is a radar correlation plot for a radar system in accordance with the present invention.
Figure 15:
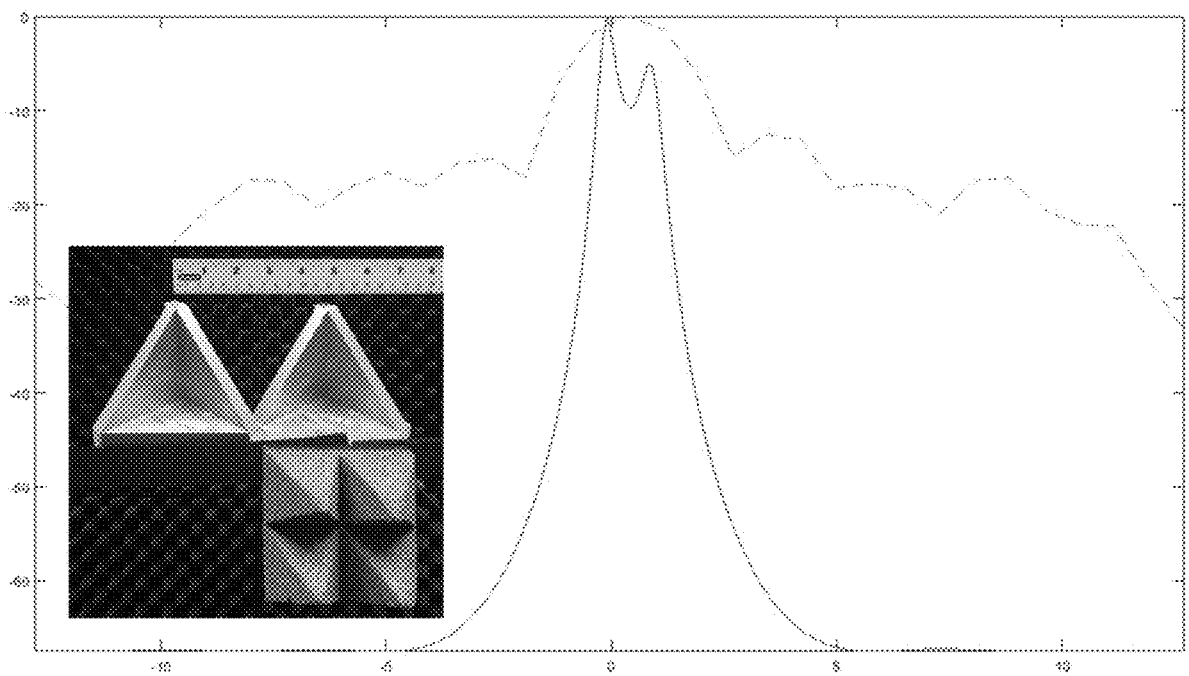
FIG. 15 is a plot illustrating an angular resolution of a radar system in accordance with the present invention.

The exemplary system measurements have been performed on a Megtron-7 antenna board with 8×2 Substrate-Integrated-Waveguide (SIW) antennas. Before running, a calibration routine adjusts the TX carrier feed-through, the RX DC offsets, and aligns the clocks for optimal synchronization of virtual receivers. FIG. 14 illustrates the system capability to recognize a target at up to 300 m with sufficient SNR. By using a +25 dBsm corner reflector, over 30 dB SNR in the correlation domain may be obtained. To prove the angular resolution capability of the system, two 10 dBsm targets were placed, separated by 116 mm at 7.0 meters distance in an anechoic chamber. FIG. 15 illustrates the results obtained after using beam-forming (dashed green line) and MUSIC (blue line). The radar is able to resolve the 2 targets with about 0.95 degrees angular resolution.

Exemplary embodiments of the present invention disclose a fully integrated digital-modulated radar system-on-chip. By shifting the modulation complexity to the digital domain, a higher level of integration to date is achieved for a radar sensor. In addition to that, the exemplary system enables mm-wave radars to achieve angular resolutions that are competitive to optical technology, such as Lidar, but at a reduced cost.

Figure 16:
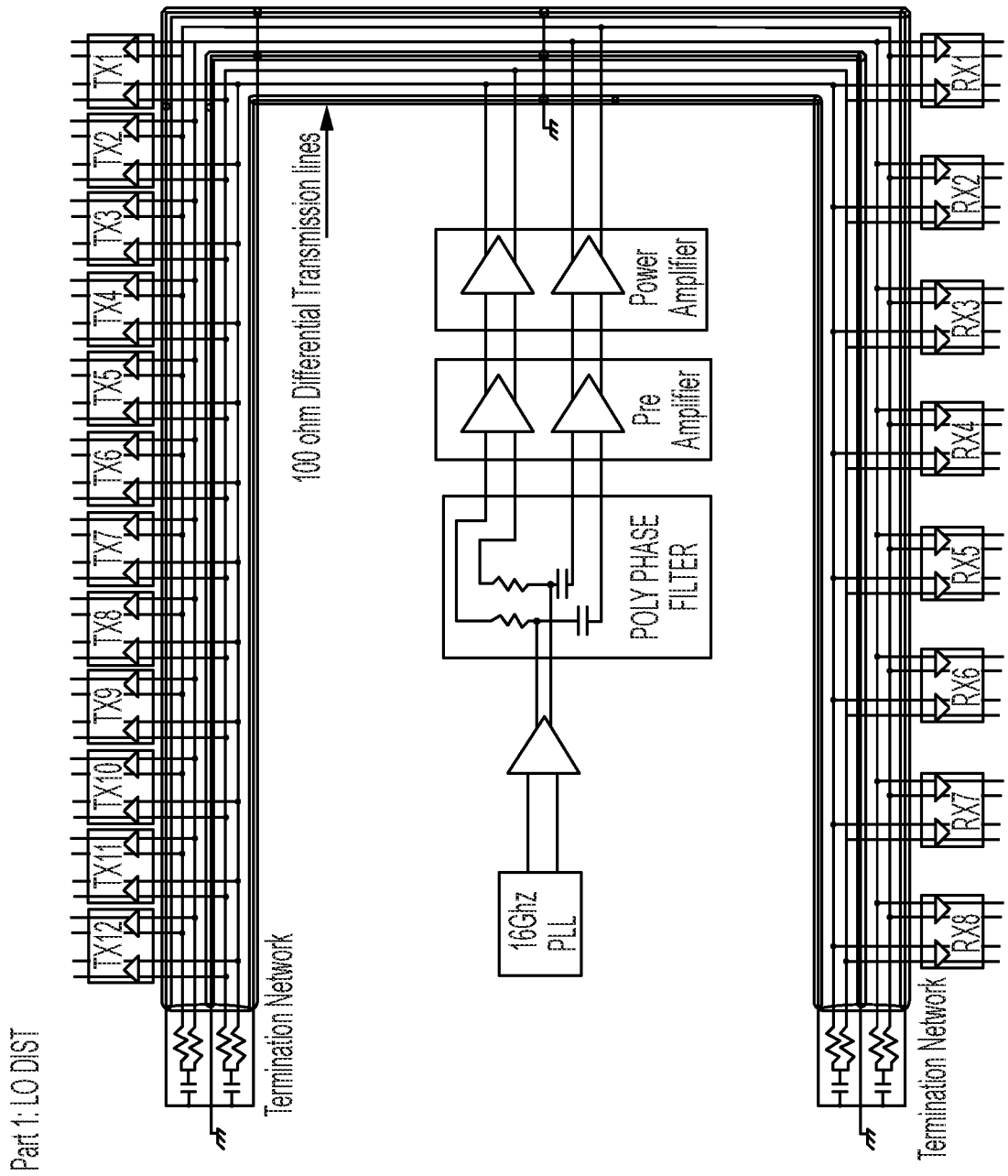
FIG. 16 is a distribution network of a radar system in accordance with the present invention.

Local Oscillator Signal Distribution:

In another exemplary embodiment of the present invention, illustrated in FIG. 16, a quadrature local oscillator (LO) signal is distributed to 12 transmitters and 8 receivers from a single PLL source, thus all the phase noise that is generated by the distribution network (in the 1 MHz region) is correlated between the TXs and RXs, this improves the effective signal to noise ration of the radar signal processing.

An exemplary PLL source has a frequency of 16 GHz and needs to drive a 400-mV peak square wave signal to drive the individual transmitters and receivers.

There needs to be as much in common between the transmitters and receivers, as far as LO phase noise goes (including the poly phase filter), so a central drive system is adopted to drive all the 12 TX and 8 RX loads at the same time with 2 quadrature signals.

Exemplary 100-0 differential transmission lines are chosen as a good compromise between loss and impedance (lower impedances have lower losses but will be harder to drive).

Broad band transmission line termination may be achieved using resistors, the transmission lines are terminated from 16 GHz to 80 GHz to terminate to the 5th harmonic of the LO. Both even and odd modes are terminated.

Exemplary TX and RX LO buffers are designed to be capacitively coupled with minimum capacitive loading. This makes the capacitance act to slightly increase the capacitance per unit section and hence reduce the characteristic impedance of the transmission line.

Because of the exemplary method of LO distribution, the channels may get their LO signal delayed by the transmission line delay, due to this, there needs to be a synchronization between adjacent channels so that the baseband can be synchronized.

Switched-Antenna Inputs in Millimeter-Wave LNA RF Front Ends:

In highly integrated radio receiver (RX) systems operating at millimeter-wave frequencies (i.e., roughly >10 GHz), it becomes increasingly difficult to realize low-loss and high-linearity RF switches in conventional CMOS silicon fabrication technologies. Minimizing the loss in the input path of the RX signal is important. Losses in the signal path contribute to an increased RX system Noise Figure (NF), which degrades the RX system's signal-to-noise ratio (SNR), a measure of overall RX system's performance. Maximizing the linearity in the input path of the RX signal is also important to avoid degradation of the RX system's SNR due to non-linear effects.

RF switches implemented using conventional CMOS technologies are poor at isolating an un-switched or unselected port (i.e., the undesired port) from the switch output. This contributes to the problem of undesired signals carried by the unselected port being coupled by the switch into the other ports. Undesired signals (from the unselected port) unusually degrade SNR, and thus overall performance of the RX system.

In addition, conventional RF switches usually take up valuable real estate in an integrated circuit layout. Many conventional RF switching techniques necessarily take up space proportional to the wavelength of operation, in order to realize the operating characteristics of the switch. Eliminating this switch saves valuable space and cost for an integrated RX system.

In the area of highly integrated receiver (RX) designs operating at very high frequencies, such as at millimeter-wave (mmWave) frequencies, embodiments of this present invention describe a circuit and physical design which enables the realization of a receiver with front-end low noise amplifiers (LNAs) having multiple switchable antenna input ports. Embodiments of the present invention enable fast switching between inputs and do not require the implementation of a lossy radio-frequency (RF) switch in the signal path.

In embodiments of this present invention, a plurality of antenna inputs each feed a plurality of first-stage LNAs, where the outputs of all of the first-stage LNAs are directly coupled together and the LNAs are physically co-located in a very tight area. In other words, there is no RF switch to select between the RX inputs. At mmWave frequencies, the co-location allows a single inductively-matching network to resonate with the parasitic capacitances of the directly-coupled output ports of the co-located LNAs. Thus, with this present invention, a very low-noise receiver front-end design at mmWave frequencies is achievable, having multiple input antenna ports, and without the traditional loss of implementing explicit RF switches to switch between antenna input ports.

In multiple-input multiple-output (MIMO) and phased array transceiver architectures, it is advantageous to be able to quickly toggle the receiver (RX) front-end input between different RX antenna ports. This can enable different arrays of antennas to be used at different times by the same transceiver system. An exemplary low-NF method of the present invention provides for fast switching between different input antenna ports at mmWave frequencies.

Conventional techniques for switching between different input antenna ports usually involve the explicit use of RF switching elements. Such techniques may require the use of complex and large-area mmWave resonant structures, and/or utilize high-performance process technologies that require more processing steps as compared to "plain" CMOS technologies, and which are thus more expensive to fabricate.

Figure 17:
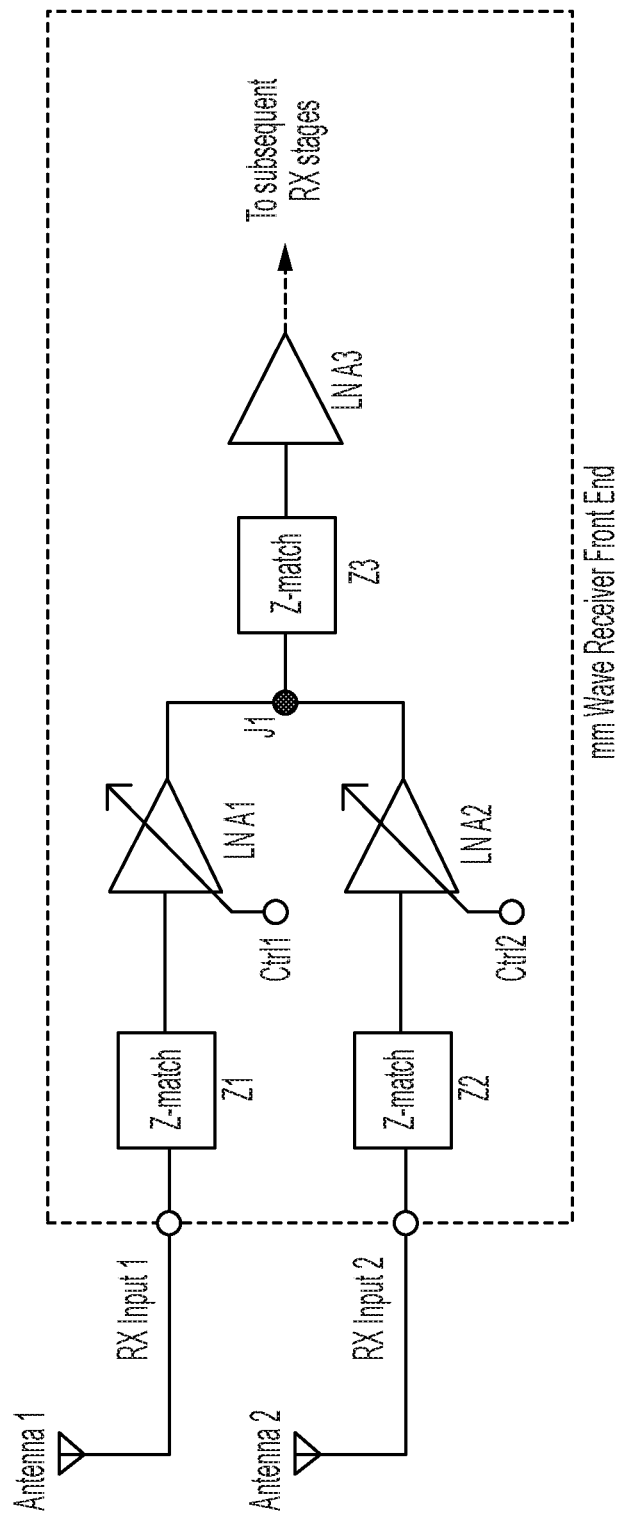
FIG. 17 is a block diagram of a millimeter wave (mmWave) receiver front end of a radar system in accordance with the present invention.

FIG. 17 illustrates an embodiment of the present invention, where an exemplary dual-input mmWave RX front end without an RF switch is illustrated. In an aspect of the present invention, FIG. 17 illustrates low-impedance direct connections between respective outputs of active amplification stages LNA1 and LNA2, at junction J1.

At mmWave frequencies, conventional techniques commonly include the use of inductive matching networks that are immediately coupled to the outputs of each individual active gain stage (i.e. one at the output of a first LNA, and another at the output of a second LNA), in order to efficiently transfer the output energy to the input of any next receiver stage (e.g. another gain stage, an RF switch, an RF mixer, and other similar stages). Without an immediate inductive matching impedance, the large parasitic capacitances that are typically present at the output terminals of an active amplification stage at mmWave frequencies will greatly impede the efficient transfer of energy to the subsequent stage in an RX chain, increasing losses in the RX signal path, and thereby degrading overall RX SNR substantially.

At mmWave frequencies and above, the physical placement of active devices and the physical dimensions of the conductors involved in the RX path of the signal, are an inherent part of the circuit design due to high parasitic capacitances and the dimensions being a non-negligible fraction of the signal wavelength. Therefore, in order to effectively implement the concept of a direct connection (J1) between the outputs of two active gain stages (LNA1 and LNA2) and the subsequent input of an inductive matching network (Z3), in an aspect of the present invention, the physical distances between LNA1, LNA2, and Z3 are minimized for maximum RX system performance (see FIG. 23, where the direct connection is labeled J2).

In another aspect of the present invention, the first active gain stages in the RX signal path (LNA1 and LNA2) are designed such that LNA1 and LNA2 can be individually either "activated" or "de-activated" with input control signals, CTRL1 and CTRL2 (see FIG. 17). When an exemplary LNA is to be "activated," as defined by the input control signals, the magnitude of the forward-direction scattering parameter "S21" is set to the desired, and usually large, forward amplification power gain for the amplifying stage. When the exemplary LNA is to be "de-activated," magnitudes of the forward-direction scattering parameter S21 and a reverse-direction scattering parameter S12, are both minimized as much as required to provide the necessary isolation for the non-activated (i.e. not selected or not desired) RX input antenna port or ports.

Referring to FIG. 17, when it is desirable for the receiver to process the RF signals of antenna 1 at RF input 1, and to not process the RF signals of all other input ports (i.e. antenna 2 at RF input 2), the first stage LNAs (LNA1 and LNA2) are controlled using their control signals (CTRL1 and CTRL2, respectively), such that LNA1 is "activated" and LNA2 is "de-activated". It will be clear to one skilled in the art of mmWave RX circuit design that the required functionality and design of each aspect of this mmWave RX front end must be deliberately designed using mmWave techniques, as explained herein, in order to realize the full functionality and benefit of embodiments of this present invention. Therefore, by selectively applying control signals (CTRL 1 and CTRL 2), LNA1 and LNA2 may be selectively activated or deactivated.

Figure 18:
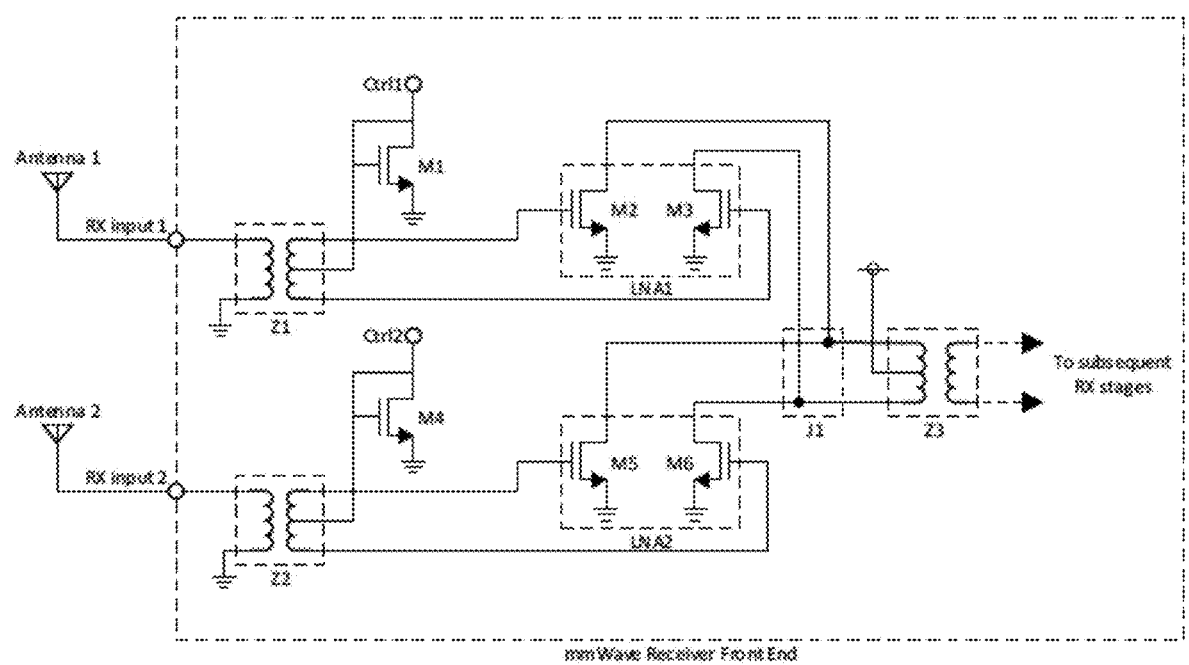
FIG. 18 is a block diagram of an mmWave receiver front end of a radar system in accordance with the present invention.

FIG. 18 illustrates an exemplary embodiment of the invention. As illustrated in FIG. 18, impedance matching networks Z1, Z2, and Z3 are implemented using integrated impedance matching transformers. In this embodiment, control signal CTRL1 is a current sink input. For example, when an appropriate current is applied to CTRL1, device M1 biases LNA1 (which includes devices M2 and M3) such that LNA1 has an intentionally large forward S21 magnitude. Conversely, removing the control signal current deactivates the LNA.

Results and Advantages:

Conventional mmWave design techniques typically require impedance matching networks at the input and output of all active amplification stages for efficient and low-noise amplification, such as around the input and output of LNA stages in an mmWave receiver front end.

Figure 19:
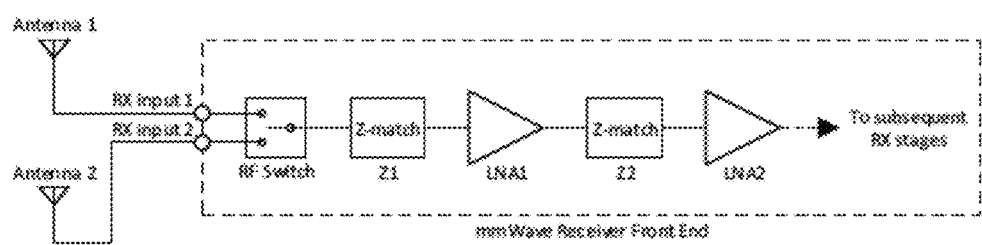
FIG. 19 is a block diagram of an mmWave receiver front end of a radar system.

MmWave RF switches are conventionally designed to present a real and relatively constant impedance at input and output ports, across the frequency band of application. This characteristic enables fast switching, ease of implementation, lower-loss, and higher-linearity operation. Thus, it is possible to connect an exemplary mmWave RF switch directly to multiple antenna input ports to switch between them, as shown in FIG. 19, however, a removal of this RF Switch contributes directly to the overall NF of the RX system since it is placed ahead of any active LNA gain stages. This degradation of SNR is a very undesirable consequence of this architecture. The design of a high-performance RF switch at mmWave frequencies in standard CMOS processes, is also non-trivial.

Figure 20:
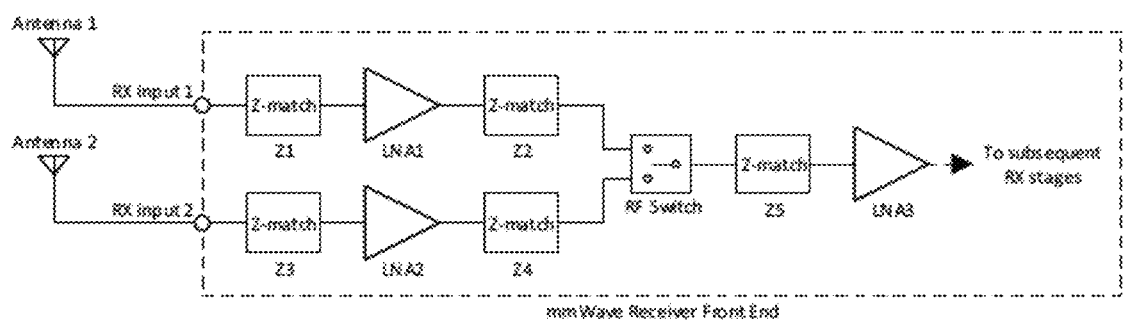
FIG. 20 is a block diagram of an mmWave receiver front end of a radar system.

In another multi-antenna RX implementation, illustrated in FIG. 20, the conventional RF switch is placed after an initial stage of LNA gain to substantially reduce the SNR degradation due to signal losses in the RF switch, however the non-linearity of the RF switch now becomes more critical due to the signal amplification placed before it. Furthermore, individual matching networks (Z2, Z4, and Z5) are now required at each port of the RF switch in order to efficiently transfer mmWave RF energy from the outputs of LNA1 or LNA2, to the switch, and then again to transfer energy from the RF switch to the input of LNA3, the second stage of active gain in this receiver implementation.

The key inherent advantages of the presented invention over the conventional embodiment illustrated in FIG. 19 is the avoidance of NF degradation, the avoidance of linearity performance degradation, as well as avoiding the general integration area and implementation challenges of employing an explicit RF Switch. The advantages of the present invention over the conventional method of FIG. 20 include the advantages listed above, as well as eliminating the need to integrate matching networks at all three ports of the RF switch (Z2, Z4, and Z5). At mmWave frequencies and in integrated differential signal topologies, these matching networks are typically large-area passive devices that are both lossy and susceptible to external magnetic interferences. It is therefore highly desirable to minimize the need for such large-area matching networks in any architecture that is chosen.

It should be noted that in the embodiment of FIG. 18, the CTRL1 and CTRL2 control inputs for LNA1 and LNA2, respectively, enable the manipulation of the S21 and S12 characteristics of the amplifiers, thereby allowing "activation" and "deactivation," as described earlier. As also discussed above, such an embodiment also provides for a single impedance matching network (Z3) at the direction connection (J1).

Figure 21:
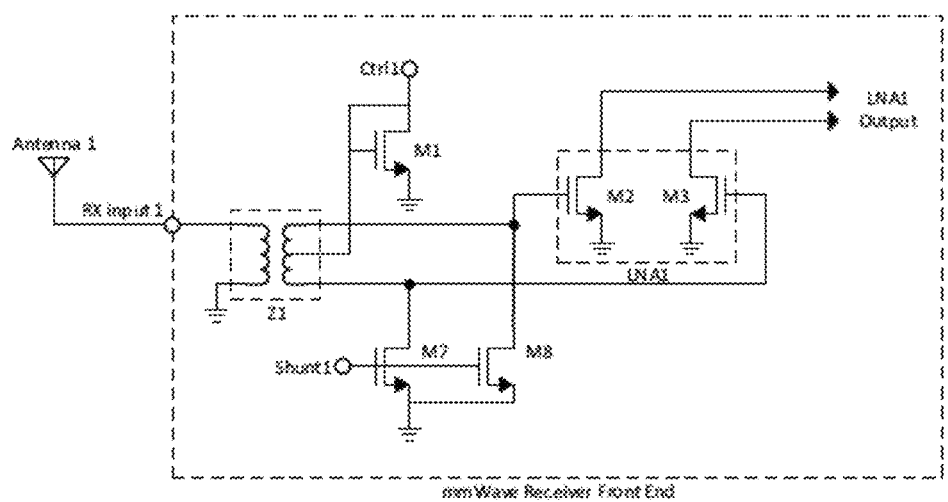
FIG. 21 is a block diagram of an mmWave receiver front end of a radar system in accordance with the present invention.

In an aspect of the present invention, the reduction of the magnitude of S12 may be further improved during the "deactivation" state of the LNA by adding additional circuitry to the input of the stage. FIG. 21 illustrates the addition of effective RF shunting devices (M7 and M8) which can be switched-on using control signal SHUNT1, during the "deactivation" state of LNA1.

When sized appropriately and designed to be effective at mmWave frequencies, these devices act to reduce the magnitude of the S12 of the LNA1 stage, when they are "switched-on." One skilled in the art of mmWave integrated circuit design can recognize the method by which these devices act, as well as other similar input-shunting design strategies.

Alternative Embodiments:

A person who is skilled in the art would also be able to recognize alternate 2-port LNA implementations and recognize that the invention described is not conceptually altered by the substitution of one 2-port LNA implementation for another. As an example of this, consider the generalized schematic of a well-known unilateralized LNA implementation which uses cross-coupled neutralization capacitors, which can be sized to cancel-out the input differential capacitance. This is known to lead to a minimization of the S12 magnitude of the 2-port LNA circuit. An example of one such unilateralized implementation is illustrated in FIG. 22.

Figure 22:
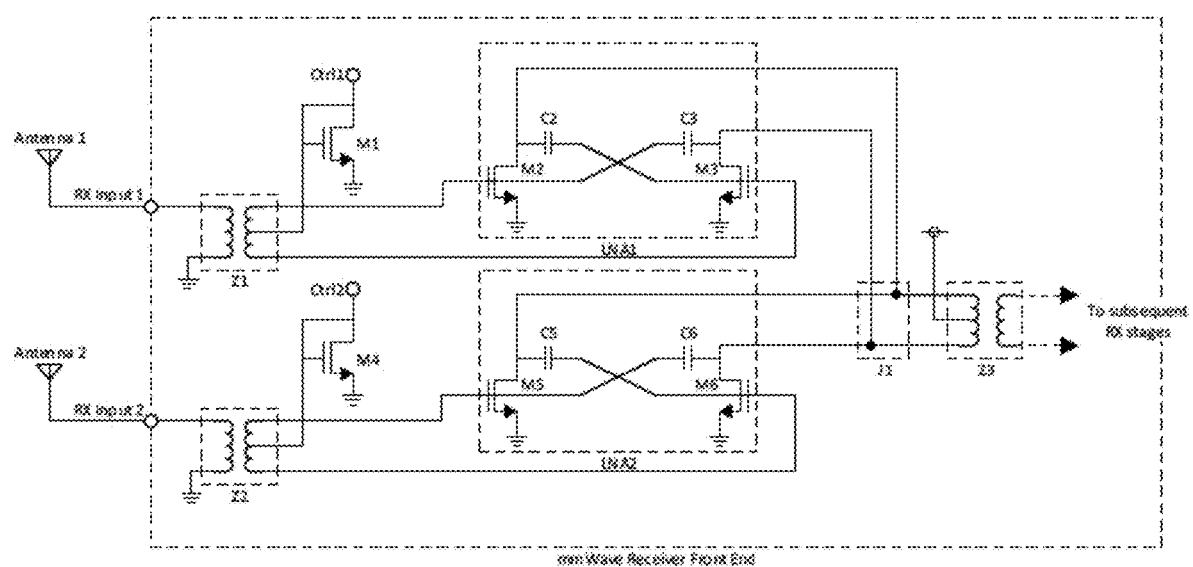
FIG. 22 is a block diagram of an mmWave receiver front end of a radar system in accordance with the present invention.
Figure 23:
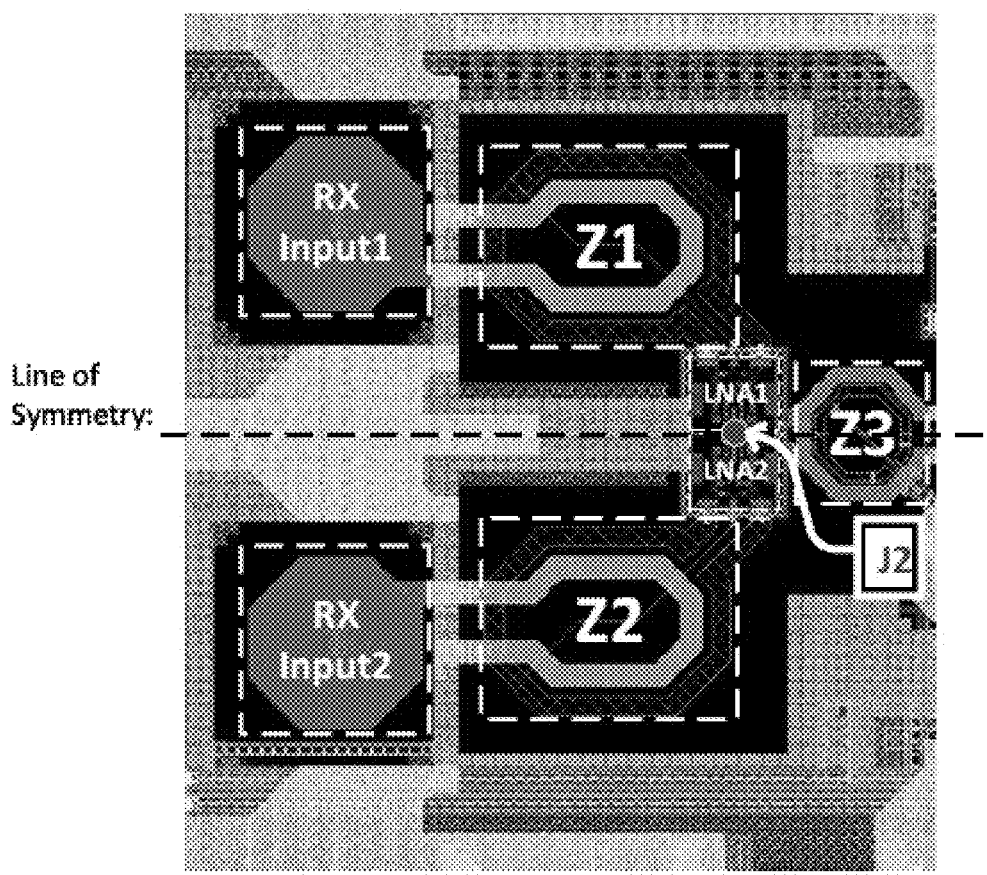
FIG. 23 is a microphotograph of a radar system in accordance with the present invention.

A person skilled in the art of integrated circuit design, as well as mmWave circuit design, can recognize the inventive and beneficial aspects of the physical implementation illustrated in FIG. 22, and implemented in FIG. 23. When configured in a dual RX input configuration (i.e., having two RX inputs and two LNAs), embodiments of this present invention allow for a very beneficial implementation of symmetry in the physical layout. As illustrated in FIG. 23, an axis of physical symmetry exists (labeled "Line of Symmetry"), such that the junction of the LNA outputs "J2" occurs at the Line of Symmetry, and in close proximity to the common output impedance matching network Z3. A dual RX input configuration of this present invention therefore has a very special physical layout that enables efficient and close physical coupling of the LNA outputs, when using the general placement, as shown above. This is beneficial since it enables one output impedance matching transformer (or network) to effectively apply to both LNA outputs, in an identical fashion.

Circuit Method and Physical Design for Millimeter-Wave Multiple-Gated Transistor LNA Non-Linear Cancellation:

In the domain of highly integrated radio-receiver (RX) systems operating at millimeter-wave (mmWave) frequencies (i.e., roughly >10 GHz), it becomes increasingly difficult to efficiently transfer energy over relatively short distances in conventional CMOS silicon fabrication technologies, without the use of impedance matching networks. The effect of parasitic capacitances and parasitic inductances on the physical connections at mmWave frequencies in an integrated circuit are substantial. This is primarily due to the very high frequencies of the signals of interest and the typically high dielectric constant of the fabrication materials used.

Minimizing the loss in the input path of the RX signal is important. Losses in the signal path contribute to increased RX system noise figure (NF), which degrades the RX system's signal-to-noise ratio (SNR), a measure of overall RX system's performance. Maximizing the linearity in the input path of the RX signal is also important to avoid degradation of the RX system's SNR due to non-linear effects.

Conventional RX front-end low noise amplifier (LNA) circuits, implemented in standard CMOS technologies, are normally designed using CMOS transistors which have non-linear transconductance characteristics. These non-linear characteristics are affected by the quiescent bias point of the transistors, among other factors.

Overall amplifier linearity can typically be improved through the use of increased power dissipation, and through feedback circuit methods which usually trade off the reduction of amplifier gain for an increase in amplifier linearity.

One less conventional but well-known method to improve amplifier linearity, low-noise or otherwise, is commonly referred to as the multiple-gated transistor method, or MGTR. This method generally comprises the use of two or more parallel amplifying paths where the independent DC biases of the respective amplifying MOS transistors are made to be individually controllable. Two common methods of attaining individual DC bias control of the parallel transistors employed include either independent gate-node biasing, or independent bulk-node biasing.

The biasing of the independent amplifier paths is then adjusted in a way such that some of the non-linear transconductance products of each of the individual paths act to cancel one another in the overall composite gain path, thereby improving overall linearity.

In the area of highly integrated receiver (RX) designs operating at very high frequencies, such as at millimeter-wave (mmWave) frequencies, this invention describes a circuit method and a physical design topology which enables the realization of a receiver's front-end low noise amplifier (LNA) at mmWave frequencies, with the ability to perform MGTR non-linearity cancellation.

Of the two previously mentioned methods for independently controlling the bias of multiple amplifying paths for the MGTR non-linear (NL)-cancellation technique, bulk-node biasing can be quite challenging to implement. The use of bulk-node biasing typically requires lowering the bulk-node voltage below that of the source node. In mmWave design it is very advantageous to have the source node of an LNA at ground potential. Lowering the voltage of the bulk node below the ground potential has its own set of challenges and complications such as in the effort required to generate a low-noise, stable, below-ground voltage. In addition, although in the literature it is professed that bulk-node biasing for MGTR application is advantageous over gate-node biasing because the NL-cancellation point is less sensitive to bias-node voltage variation, this is in-fact a disadvantage of that method. The ability to adjust the bias-point of what is referred to as the auxiliary transistor (AT) device using bulk-node biasing is more limited than that of using gate-node biasing.

Once it is decided to use gate-node biasing for MGTR NL-cancellation in a mmWave LNA, a method is needed for independently adjusting the gate-node voltages of the different amplifying paths. This is problematic at mmWave frequencies where parasitic capacitances and inductances are easily accumulated with every additional component added to the LNA circuit design in the mmWave signal path.

As described in the next section, all examples of gate-node biased MGTR LNA designs utilize capacitive elements, placed in series with the inputs, to de-couple the common input signal node from the independently controlled LNA gate-nodes, such that they can be independently biased at different gate-to-source voltages.

This invention describes a circuit method and physical design topology which enables independent gate-node biasing in an mmWave LNA design, while avoiding the use of series-coupled capacitive elements in the RF signal path. This invention also describes a multiple-winding input impedance transformer design which conveniently enables MGTR gate-node biasing, in an integrated circuit design.

Examples of MGTR non-linearity cancellation techniques can be found, however these techniques have additional challenges if applied at mmWave frequencies, due to the exacerbated effects of parasitic elements at high frequencies.

Figure 24:
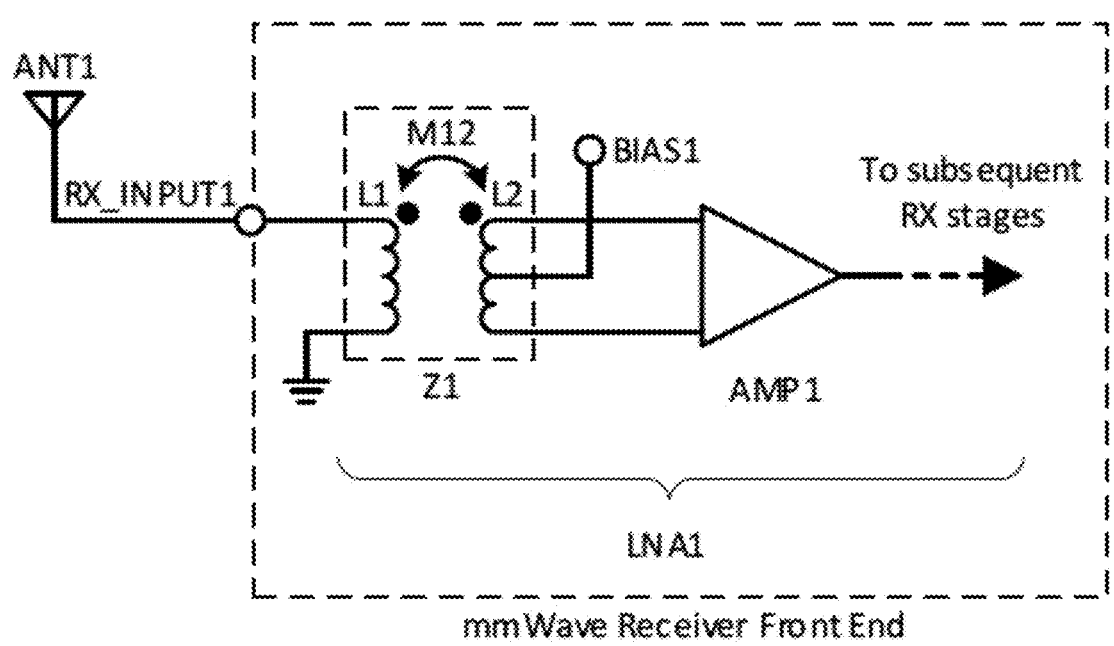
FIG. 24 is a block diagram of an mmWave receiver front end of a radar system in accordance with the present invention.

Illustrated in FIG. 24 is a typical conventional integrated mmWave receiver front end. Note that the output of the mmWave amplifier (AMP1) is shown only symbolically with a single arrow to show the output signal path and direction. This arrow is not intended to convey the nature of the output signal as to being single-ended in nature. In contrast, the input signals of amplifier AMP1 are indeed intended to illustrate the differential input signal path from Z1 to AMP1. A person skilled in the art would be able to understand the significance of highlighting the input connections as differential signals and with more detail, while leaving the output connections to AMP1 in a more abstract and only symbolic form, for increased clarity and emphasis.

As illustrated in FIG. 24, typical conventional integrated mmWave receiver front ends commonly use an input impedance matching network (Z1) to match the input impedance of the antenna and the RX input port (RX_INPUT1) to the input of the amplifying transistor devices of the input amplifier (AMP1), while optimizing for low-noise, high-linearity, or otherwise. It is also common for Z1 to optionally provide a single-ended input to differential output conversion as well, as shown in this illustration. It is well understood that an inductive matching network can be used to resonate with unavoidable and/or unwanted parasitic capacitances in the physical design, to effectively cancel and minimize these parasitic conductance paths. This is especially important at mmWave frequencies where parasitic impedance elements are very easily accumulated and usually impractical to avoid. Using mutually-coupled inductive-matching networks, it is possible to enable the efficient transfer of mmWave RF energy from the antenna through to the input of the amplifying transistors, despite natural parasitic capacitances present in the physical implementation of the design.

Figure 25:
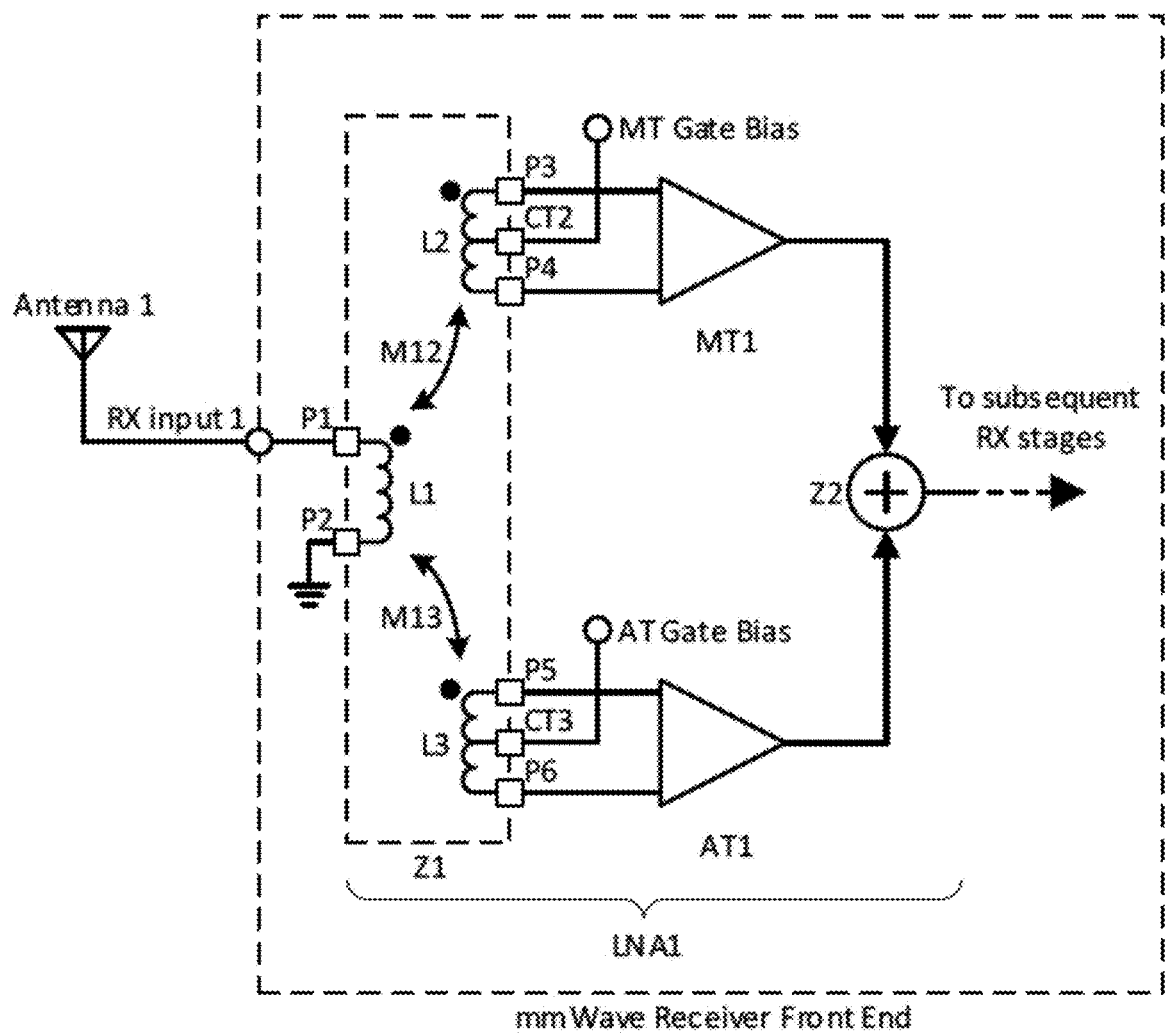
FIG. 25 is a block diagram of an mmWave receiver front end of a radar system in accordance with the present invention.

The current invention is illustrated in FIG. 25, where an exemplary integrated mmWave RX front end is illustrated which also enables the MGTR non-linearity cancellation technique using gate-node biasing. A 3-winding (Trifilar) integrated planar transformer is used to implement the impedance matching element "Z1", and also to enable independent DC biasing of the main-transistor amplifier (MT1) versus the auxiliary-transistor amplifier (AT1). MT gate-node biasing is achieved by altering the DC voltage at the center-tap of inductor L2, through the port annotated "CT2". Similarly, AT gate-node biasing is achieved by altering the DC voltage at the center-tap of inductor L3, through the port annotated "CT3".

The output signal paths from amplifiers MT1 and AT1, as well as the summation element Z2, are shown only symbolically. It is understood that in a practical integrated-circuit implementation, differential signaling for the outputs and for the summation are typically beneficial to overall system performance. For the MGTR technique to provide non-linearity cancellation, it is well understood that the MT amplifier and AT amplifier path outputs need to be combined through summation. Additionally, most conventional amplifier stages in mmWave integrated circuit designs typically require impedance matching networks at both their inputs and outputs. Matching networks can cancel out parasitic impedances, provide intentional impedance characteristics to optimize system noise and or linearity, as well as to efficiently transfer RF energy into the amplifier from preceding RX stages, as well as out of the amplifier towards subsequent RX stages. In the current invention, Z2 can be readily realized using the direct-coupling of MT and AT amplifier output signal nodes, and can be combined with an immediate impedance transformation network (usually inductive in nature).

At mmWave frequencies and above, the physical placement of active devices and the physical dimensions of the conductors involved in the RX path of the signal are an inherent part of the circuit design. This is generally due to the increased effect of impedance parasitics and the dimensions of physical implementations being a non-negligible fraction of the signal wavelength, leading to large effective electrical distances for mmWave frequencies. Therefore, to effectively implement the desired functions of Z2 with maximum performances of the overall LNA1, it is typically beneficial to minimize the physical distances between the outputs of MT1 and AT1, as well as the distance from these outputs to the input of the inductive matching element of Z2.

Figure 26:
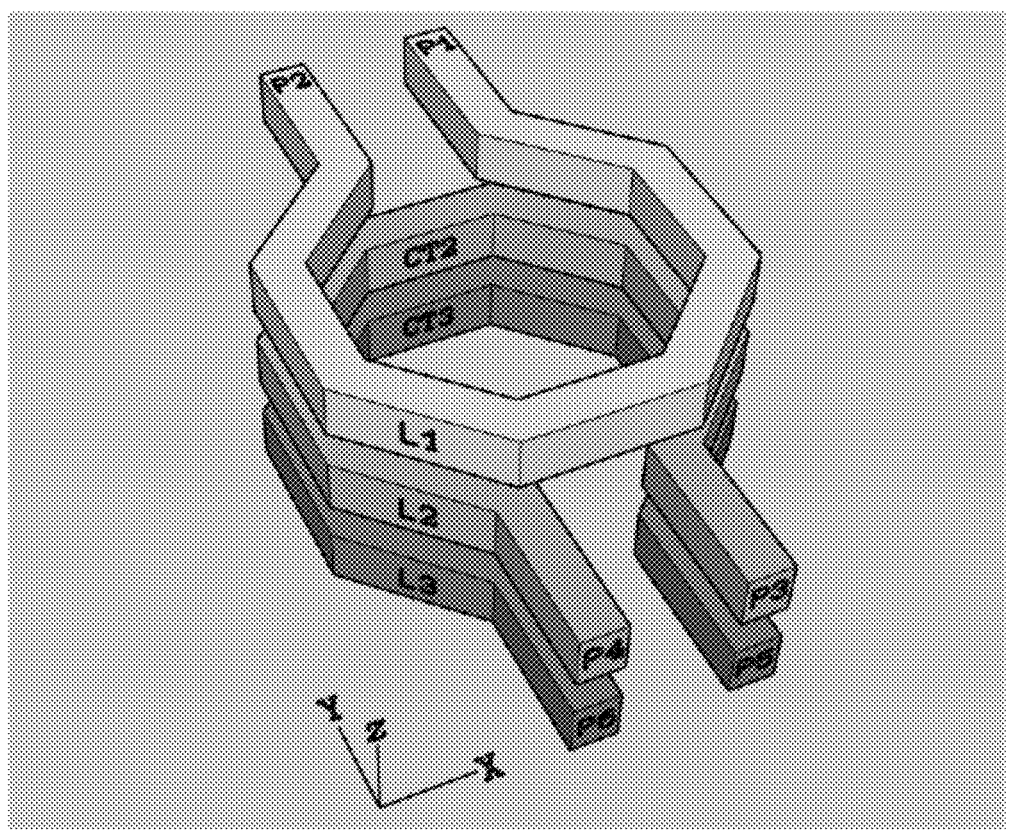
FIG. 26 is a block diagram of a 1:1:1-turn Trifilar planar integrated transformer of a radar system in accordance with the present invention.

Shown in FIG. 26 is a conceptual drawing of a general 1:1:1-turn Trifilar planar integrated transformer. Metal layers annotated with L1, L2, and L3, as well as the port-labels P1 through P6, and center-tap ports CT2 and CT3, also all correctly match the components and ports that are similarly annotated in FIG. 26.

Although only a general 1:1:1-turn implementation is illustrated conceptually in FIG. 26, it is understood by those skilled in the art that different effective Trifilar transformer turn-ratios, winding shapes, winding dimensions, and winding arrangements are also effective in practice to achieve a desired magnetic and impedance matching characteristic, for the specific application of use. Many different configurations of a Trifilar planar integrated transformer can be effectively used in accordance with this invention.

In further accordance with this invention, the necessary functions which the input Trifilar transformer enables when applied to gate-node MGTR biasing and operation at mmWave frequencies, comprise the following:

The coupling of an input signal magnetically to a plurality of DC-isolated output windings, enabling independent DC-biasing of the output windings.

Coupling the DC-isolated output windings directly to the input Gate-Nodes of independent transconductance amplifying paths.

Enabling the direct adjustment of the DC bias voltages of the independent DC-isolated output windings to affect the gate-node bias values of independent transconducting amplifying devices and signal paths.

To provide inductive port-matching impedances at all ports, as needed for impedance matching at mmWave frequencies.

To provide common-mode electrical ports, such as center-tap ports, where a DC bias voltage and current can be conveniently applied without adversely affecting the differential component of the RF signals being communicated through the transformer.

To provide high levels of mutual magnetic and capacitive coupling between each of the windings to enable the efficient coupling of mmWave RF energy from the input of the transformer to the outputs.

To provide a physically symmetric method of matching a differential RF input signal to multiple differential RF outputs, each of which are DC isolated and able to be biased independently from electrically-symmetric center-tap points.

In one preferred integrated-circuit embodiment of this invention, where Z1 is implemented with a Trifilar planar integrated transformer, an important aspect of this invention is to realize the inductances L2 and L3 by using coincident physical winding shapes on adjacent layers of metal. For clarity, this specifically means the stacking of metal-layer winding L2 directly above (or below) the metal-layer of winding L3, in a planar integrated circuit process. This coincident stacking causes the parasitic capacitances between inductors L2 and L3 to not become a relevant component in the efficient transfer of mmWave RF energy, in a differential signal sense, from the RX input port (RX input1) to the amplifying device inputs of MT1 and AT1. In addition, this coincident stacking of L2 and L3 conveniently enables the very close proximity of the amplifying transistors of MT1 and AT1, which is critically beneficial at mmWave frequencies to avoiding the accumulation of unwanted parasitic impedances due to large electrical distances between components.

It is well known in the state of the art that in the MGTR Non-Linear cancellation technique, it is common to scale the device area and electrical component values of the "MT" signal path with respect to the "AT" signal path. In accordance with embodiments of the present invention, MT-to-AT device-scaling ratio can also be implemented in the Trifilar transformer physical and electrical design. The concepts of an "MT" winding and an "AT" winding are introduced, and are applied to individual output windings of Z1 (i.e. L2 and L3 windings). The physical design of these windings, and of the Trifilar transformer Z1, can be such that the electrical impedances seen looking into the respective port windings, can be scaled appropriately with the MT-to-AT device scaling ratio. It is understood by someone skilled in the art that although the invention is described in terms of two amplifying paths "MT" and "AT," that the invention is not limited to only two amplifying paths. A plurality of output windings may be used and scaled appropriately to match a plurality of output signal paths, each of which may be individually gate-node biased.

Figure 27:
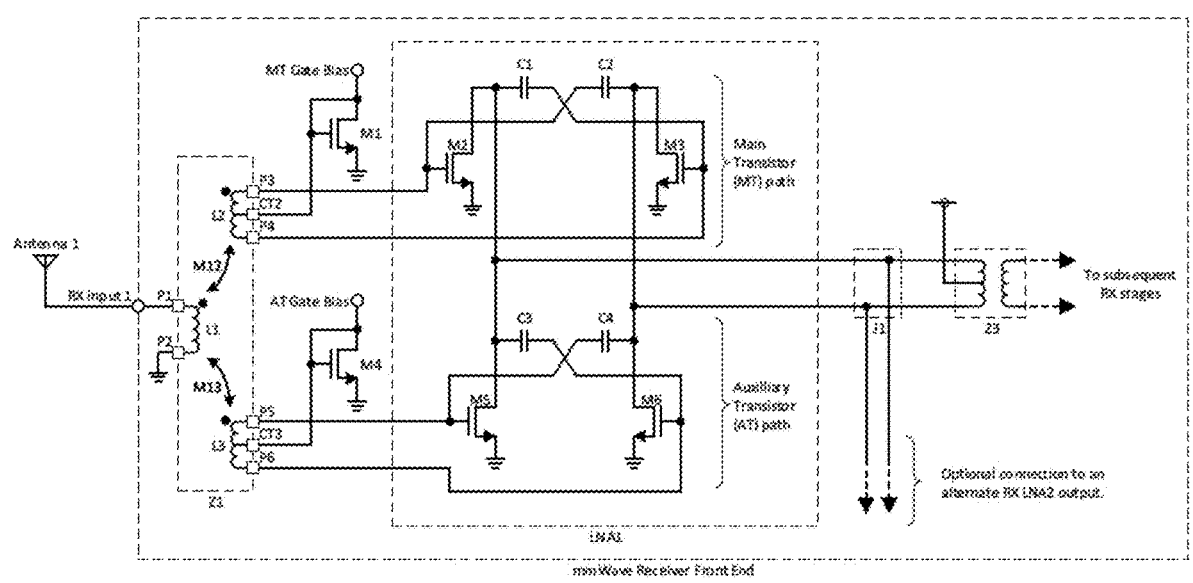
FIG. 27 is a block diagram of an mmWave receiver front end of a radar system in accordance with the present invention.

Illustrated in FIG. 27 is a more detailed circuit description for an exemplary mmWave receiver front end, in accordance with this invention. The MT and AT amplifying paths are implemented here using unilateralized source-grounded differential amplifiers. A person skilled in the art will recognize C1 and C2 as unilateralizing components of the annotated MT path, and C3 and C4 as unilateralizing components of the annotated AT path. In accordance with embodiments of this present invention, the use of a Trifilar transformer Z1 enables direct connection of the gate nodes of the individual transconductance amplifiers. In addition, the DC bias capability afforded by the center-tap connections CT2 and CT3, allow diode-connected devices M1 and M4 to be used to set the gate-node bias values for the MT and AT amplifiers, respectively.

Another aspect of this invention is the use of diode-connected transistors M1 and M4 to establish the gate-node voltages in response to input bias currents, at nodes MT gate bias and AT gate bias, through the output windings L2 and L3, of Z1. The diode-connected devices act as DC current mirrors, and are intentionally matched to the MT and AT amplifying devices. Digitally-controlled current DACs (digital to analog converters), which are not shown below, are used to provide precise bias currents and fine trimming control, to the MT and AT transconductors, by way of the DC current mirror diodes M1 and M4, illustrated in the figure.

Another aspect of the invention is to design the first active gain stages in the RX signal path (MT1 and AT1) such that they can be either individually or collectively "activated" or "de-activated" with input control signals, "MT gate bias" and "AT gate bias". When said to be "activated," the magnitude of the forward-direction scattering parameter "S21" is set to the desired, and usually large, forward amplification power gain for the amplifying stage. When said to be "deactivated", both magnitudes of the forward-direction scattering parameter S21 and reverse-direction scattering parameter S12, are minimized as much as required to provide the necessary isolation from the non-activated (i.e. not selected or not desired) RX input antenna port or ports.

A further aspect of this invention is the ability to directly couple two or more individual MGTR NL-cancellation mmWave receiver front ends at junction "J1," while sharing a common output impedance transformation network "Z3". In FIG. 27 this is made clear by the illustration of the "Optional connection to an alternate RX LNA2 output".

This ability to activate and de-activate the MGTR amplifying paths along with the ability to couple two or more individual LNA outputs, is particularly advantageous since it enables this invention to be fully compatible with the use of switched-antenna inputs in millimeter-wave LNA RF front ends, as described herein.

Figure 28:
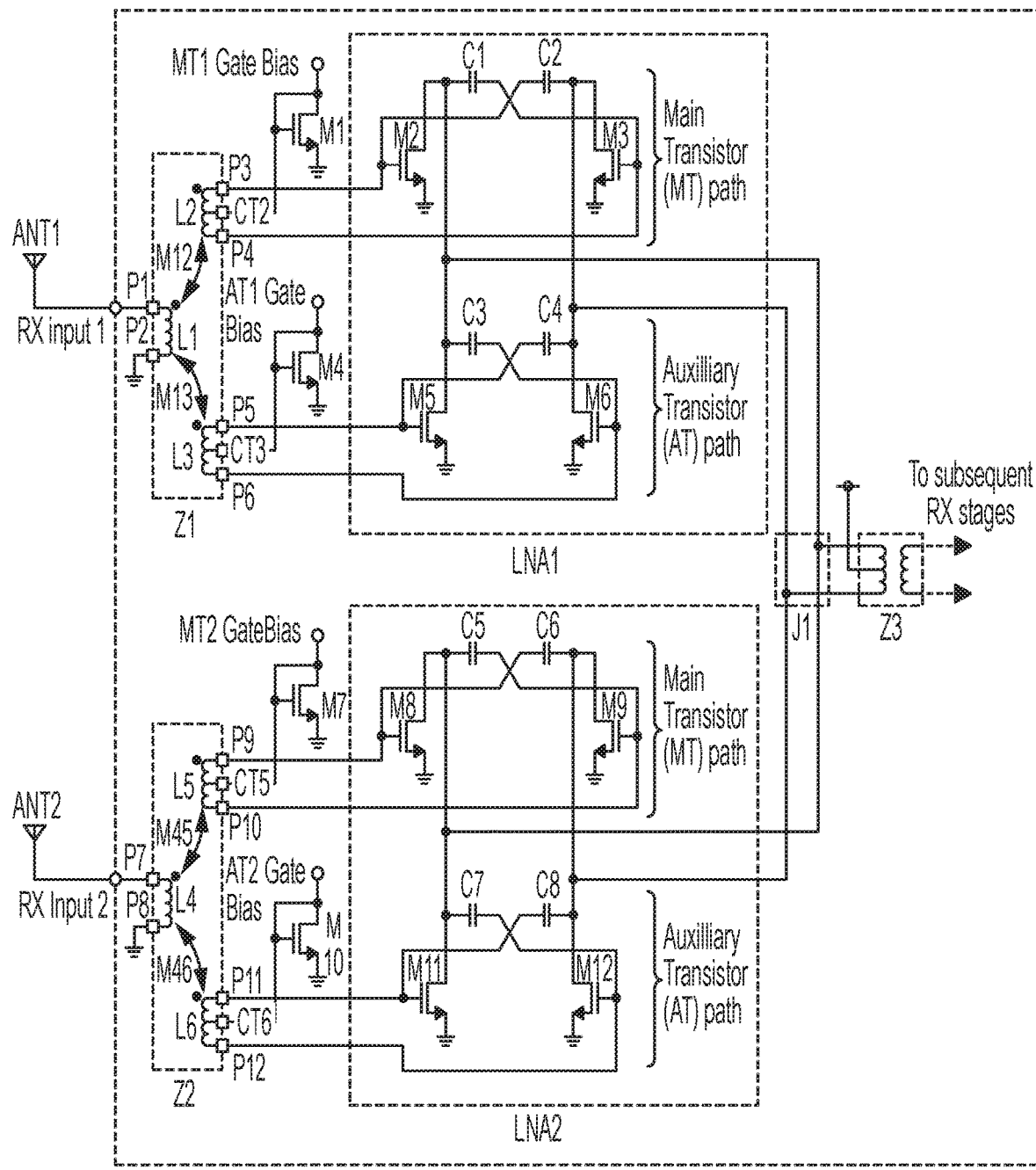
FIG. 28 is a block diagram of a dual-RX input with MGTR non-linearity cancellation of a mmWave receiver front end of a radar system in accordance with the present invention.

The combination of these two embodiments together provides for a novel integrated mmWave RX front end configuration, illustrated in FIG. 28.

FIG. 28 illustrates an exemplary mmWave RX front end, having two RX inputs, enabling two RX antennas (ANT1 and ANT2), and also enabling gate-node biased MGTR non-linearity cancellation capability for each of LNA1 and LNA2. The outputs of LNA1 and LNA2 are combined in junction J1 and then impedance matched in a common impedance matching network Z3.

Conventional mmWave radar systems require highly-linear mmWave RX front ends. The MGTR non-linear cancellation technique enhances the linearity of the LNA to which it is applied, and thus to the entire integrated receiver. One particular advantage of this exemplary embodiment is to effectively apply the MGTR NL-cancellation technique to a mmWave frequency LNA design. The invention enables precise and wide-range gate-node bias control of transconductance characteristics of individual MT and AT amplifiers, while still allowing highly efficient impedance transformations to be realized. Conventional and otherwise well-known techniques that have been applied at sub-mmWave frequencies, do not perform well at mmWave frequencies. This invention uniquely enables gate-node bias control of MGTR functionality, with almost no penalty in mmWave performance of the LNA design.

Embodiments of this present invention are also compatible with coupling multiple MGTR LNA outputs, such that a mmWave RX system can employ both the MGTR capability and fast RX input switching, in a very compact and highly symmetric physical implementation.

Embodiments of this present invention are also compatible with common CMOS integrated-circuit technologies and do not rely on isolated-well bulk-node connections, nor silicon-on-insulator technologies for independent transconductor bias control.

Alternative Embodiments:

A person skilled in the art would also be able to recognize that alternate amplifier topologies can be substituted for each of the MT and AT amplifiers used in all of the described LNA circuits, and that the inventive aspects of this invention are not conceptually altered by the substitution of one 2-port amplifier implementation for another.

For example, the use of unilateralized versus non-unilateralized amplifiers does not alter the inventive aspects described. Similarly, the use of what is commonly known as a tail current-source, or other types of active or passive feedback, would not alter the capabilities afforded by the use of the Trifilar transformer at the input.

Similarly, the use of a multi-filar transformer having multiple output windings to independently control the gate-node bias of multiple amplifying paths, would also be understood to be covered by this invention.

Similarly, the use of MT and AT amplifiers having source degenerative inductances, or other components and configurations, would also be understood to be covered by this invention.

Similarly, the use of common-gate amplifier topologies for the MT and AT amplifiers, where the source-nodes are the input nodes of the amplifier, would also be understood to be covered by this invention. In this case, for example, the source-node voltages would be controllable through the input impedance transformer "Z1".

Figure 29:
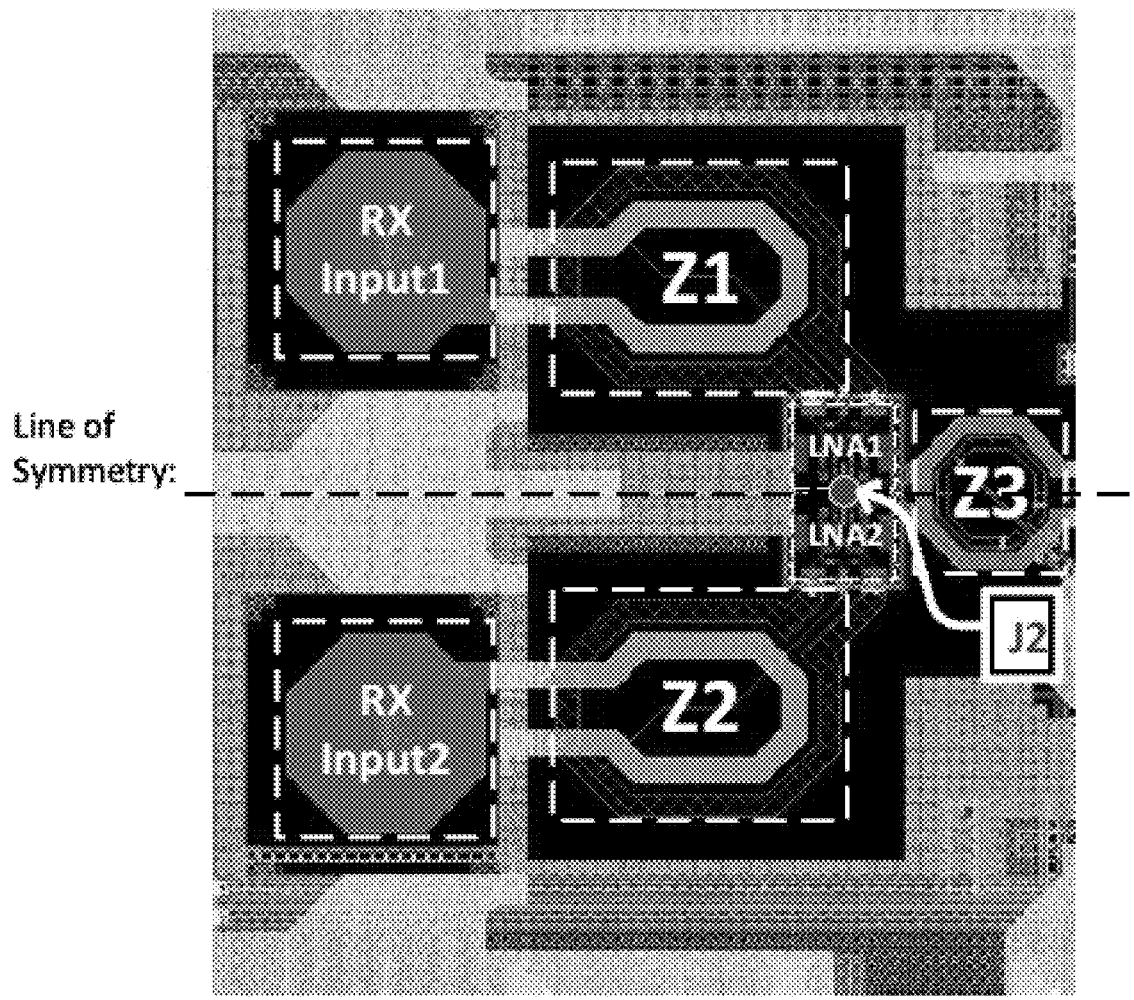
FIG. 29 is a microphotograph of a radar system in accordance with the present invention.

Integrated Circuit Embodiment:

A person skilled in the art of integrated circuit design as well as mmWave circuit design can recognize the inventive and beneficial aspects of the physical implementation of the receiver front end illustrated in FIG. 29.

The integrated-circuit physical implementation of this invention can be seen to lead to a highly integrated, fully differential, fully symmetric, and compact physical layout, as shown.

When configured in a dual RX input configuration (i.e. having two RX inputs and two LNAs) as illustrated, embodiments of this present invention allow for a very beneficial implementation of symmetry in the physical layout. As illustrated in FIG. 29, an axis of physical symmetry exists (labeled "Line of Symmetry"), such that the junction of the LNA outputs "J2" occur at the Line of Symmetry, and in close proximity to the common output impedance matching network "Z3". A dual RX input configuration of this invention therefore has a very special physical layout that enables efficient and close physical coupling of the LNA outputs, when using the general placement, as shown. This is beneficial as it enables one output impedance matching transformer (or network) to effectively apply to both LNA outputs, in an identical fashion.

Changes and modifications in the specifically described embodiments can be carried out without departing from the principles of the present invention, which is intended to be limited only by the scope of the appended claims, as interpreted according to the principles of patent law including the doctrine of equivalents.

The invention claimed is:

1. A radar sensing system for a vehicle, the radar sensing system comprising:
    a transmitter configured for installation and use in a vehicle, and configured to transmit radio signals;
    a receiver configured for installation and use in the vehicle and comprising a plurality of antennas, and configured to receive via the antennas, radio signals that include the transmitted radio signals transmitted by the transmitter and reflected from objects in an environment, wherein the plurality of antennas comprises a first antenna and a second antenna;

wherein the receiver comprises a plurality of inputs and a plurality of individually arranged low noise amplifiers (LNAs), wherein each input of the plurality of inputs is an antenna output from a respective antenna of the plurality of antennas, wherein each input of the plurality of inputs is communicatively coupled to a corresponding LNA of the plurality of LNAs, such that an antenna output from the first antenna is coupled to a first LNA via a first impedance matching transformer of a plurality of impedance matching transformers and an antenna output from the second antenna is coupled to a second LNA via a second impedance matching transformer of the plurality of impedance matching transformers, wherein each of the plurality of impedance matching transformers is configured to receive a current sink input as an activation control signal, wherein each respective antenna output is at least a portion of the received radio signals, such that a respective portion of the received radio signals is coupled to each corresponding LNA of the plurality of LNAs, and wherein the individually arranged first LNA and second LNA are co-located, wherein the first LNA and the second LNA are individually activated such that the respective portions of the received radio signals received at the first LNA and the second LNA are isolated from each other, wherein the first LNA and the second LNA are configured such that an activation of a particular LNA of the first LNA and the second LNA selects for processing a corresponding portion of the received radio signals received at the activated LNA, and further such that a deactivation of a particular LNA of the first LNA and the second LNA isolates a corresponding portion of the received radio signals received at the deactivated LNA, and wherein respective outputs of the first LNA and the second LNA are directly coupled together at a connection point.

2. The radar sensing system of claim 1, wherein each LNA of the plurality of LNAs is an active gain stage.

3. The radar sensing system of claim 1, wherein the plurality of impedance matching transformers is positioned between the plurality of inputs and the plurality of LNAs such that each input of the plurality of inputs is communicatively coupled to a corresponding LNA of the plurality of LNAs via a corresponding impedance matching transformer of the plurality of impedance matching transformers.

4. The radar sensing system of claim 3 further comprising another impedance matching transformer directly coupled to the connection point.

5. The radar sensing system of claim 4, wherein at least one of the impedance matching transformers is a trifilar planar integrated transformer.

6. The radar sensing system of claim 4, wherein the another impedance matching transformer is arranged adjacent to the plurality of LNAs.

7. The radar sensing system of claim 4, wherein the plurality of impedance matching transformers, the LNAs, and the another impedance matching transformer are arranged symmetrically with respect to the connection point.

8. The radar sensing system of claim 1, wherein each LNA of the plurality of LNAs is configured to individually activate and deactivate as defined by a respective activation control signal, such that each LNA of the plurality of LNAs is selectively activated while a respective activation-input control signal is received, wherein a deactivated LNA has both forward-direction scattering parameter S21 and reverse-direction scattering parameter S12 minimized such that an input of the plurality of inputs that is coupled to the deactivated LNA is isolated from other simultaneously received inputs of the plurality of inputs.

9. The radar sensing system of claim 8 further comprising a plurality of shunting devices, wherein respective shunting devices of the plurality of shunting devices are coupled to respective inputs of the plurality of inputs, and are configured to further reduce the magnitude of the S12 when each LNA of the plurality of LNAs is deactivated.

10. The radar sensing system of claim 1, wherein each LNA of the plurality of LNAs comprise a pair of cross-coupled neutralization capacitors configured to cancel out input differential capacitance.

11. The radar sensing system of claim 1, wherein the transmitter is a millimeter wave transmitter, wherein the receiver is a millimeter wave receiver, and wherein the transmitter is configured to transmit phase-modulated radio signals.

12. The radar sensing system of claim 1, wherein the first antenna and the second antenna are configured to provide different receiver antenna profiles to the receiver.

13. A radar sensing system for a vehicle, the radar sensing system comprising:

a plurality of transmitters configured for installation and use in a vehicle, and configured to transmit radio signals;

a plurality of receivers configured for installation and use in the vehicle, wherein each of the plurality of receivers comprises a respective plurality of antennas, and wherein each of the plurality of receivers is configured to receive via respective pluralities of antennas, radio signals that include the transmitted radio signals transmitted by the transmitters and reflected from objects in an environment;

wherein a first receiver of the plurality of receivers comprises first and second antenna outputs and first and second low noise amplifiers (LNAs), wherein the first and second LNAs are individually arranged, wherein the first and second antenna outputs are from corresponding first and second antennas of the first receiver's plurality of antennas, wherein the first and second antenna outputs are communicatively coupled to the corresponding first and second LNAs, respectively via corresponding first and second impedance matching transformers of a plurality of impedance matching transformers, wherein each of the plurality of impedance matching transformers is configured to receive a current sink input as an activation control signal, wherein each respective antenna output of the first and second antenna outputs is at least a portion of the received radio signals, such that respective portions of the received radio signals are coupled to the first and second LNAs, respectively, and wherein the individually arranged first and second LNAs are co-located, wherein respective outputs of the first and second LNAs are directly coupled together at a connection point, wherein the first and second LNAs are individually activated such that the respective portions of the received radio signals received at respective LNAs of the first and second LNAs are isolated from each other, wherein the first and second LNAs are configured such that an activation of a particular LNA of the first and second LNAs selects for processing a corresponding portion of the received radio signals received at the activated LNA, and further such that a deactivation of a particular LNA of the first and second LNAs isolates a corresponding portion of the received radio signals received at the deactivated LNA, and wherein the first and second antenna outputs, and the first and second LNAs are symmetrically arranged around the connection point.

14. The radar sensing system of claim 13, wherein the first and second LNAs are each active gain stages.

15. The radar sensing system of claim 13 further comprising a third impedance matching transformer of the plurality of impedance matching transformers directly coupled to the connection point.

16. The radar sensing system of claim 15, wherein at least one of the first, second, and third impedance matching transformers is a trifilar planar integrated transformer.

17. The radar sensing system of claim 15, wherein the third impedance matching transformer is arranged adjacent to the first and second LNAs.

18. The radar sensing system of claim 13, wherein the first and second LNAs are configured to individually activate and deactivate as defined by respective activation control signals, such that each of the first and second LNAs are selectively activated while a respective activation control signal is received, wherein a deactivated LNA comprises both a forward-direction scattering parameter S21 and a reverse-direction scattering parameter S12 minimized such that the antenna coupled to the deactivated LNA is isolated from other antenna outputs.

19. The radar sensing system of claim 18 further comprising first and second shunting devices, wherein the first and second shunting devices are coupled to the first and second antenna outputs, respectively, and configured to further reduce the magnitude of the S12 when one of the first and second LNAs is deactivated.

* * * * *